US010575602B2

(12) United States Patent
Perkins et al.

(10) Patent No.: US 10,575,602 B2
(45) Date of Patent: Mar. 3, 2020

(54) CONSUMER PRODUCT ATTACHMENT SYSTEMS HAVING A LOCKING ASSEMBLY

(71) Applicant: Apple Inc., Cupertino, CA (US)

(72) Inventors: Ryan C. Perkins, San Francisco, CA (US); Michael J. Webb, Scotts Valley, CA (US); Stephen Dey, San Francisco, CA (US); Osamu Yabe, Mountain View, CA (US); Hsiang Hung Chen, New Taipei (TW)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/165,980

(22) Filed: Oct. 19, 2018

(65) Prior Publication Data

US 2019/0053584 A1 Feb. 21, 2019

Related U.S. Application Data

(63) Continuation of application No. 15/867,621, filed on Jan. 10, 2018, now Pat. No. 10,123,593, which is a
(Continued)

(51) Int. Cl.
*A44C 5/14* (2006.01)
*A44B 11/25* (2006.01)
(Continued)

(52) U.S. Cl.
CPC ............ *A44C 5/14* (2013.01); *A44B 11/2596* (2013.01); *A44B 11/263* (2013.01); *A44C 5/147* (2013.01);
(Continued)

(58) Field of Classification Search
CPC ... G04B 37/1486; A44C 5/14; A44B 11/2596; A44B 11/2503; A44D 2203/00
See application file for complete search history.

(56) References Cited

U.S. PATENT DOCUMENTS

| | | | |
|---|---|---|---|
| 2,126,263 | A | 8/1938 | Kestenman |
| 2,346,887 | A | 4/1944 | Winkler |

(Continued)

FOREIGN PATENT DOCUMENTS

| | | |
|---|---|---|
| CH | 694393 | 12/2004 |
| CN | 2052214 | 2/1990 |

(Continued)

OTHER PUBLICATIONS

Author Unknown, "Ikepod Wristwatches by Mark Newson," http://www.dezeen.com/2007/12/10/ikepod-wristwatches-by-marc-newson/ , 32 pages, Dec. 10, 2007.

(Continued)

*Primary Examiner* — Corey N Skurdal
(74) *Attorney, Agent, or Firm* — Morgan, Lewis & Bockius LLP

(57) ABSTRACT

Embodiments of the present disclosure provide a locking assembly for an attachment system of an electronic device. More specifically, embodiments of the present disclosure are directed to an attachment unit that is configured to be inserted and removed from a housing of a consumer product. The attachment unit and/or the housing includes a catch member or other such locking assembly configured to relaseably secure the attachment unit within the housing.

17 Claims, 27 Drawing Sheets

Related U.S. Application Data continuation of application No. 14/684,138, filed on Apr. 10, 2015, now Pat. No. 9,894,964.

(60) Provisional application No. 62/048,248, filed on Sep. 9, 2014, provisional application No. 62/036,080, filed on Aug. 11, 2014.

(51) Int. Cl.
*A44B 11/26* (2006.01)
*A44C 5/20* (2006.01)
*G04B 37/14* (2006.01)

(52) U.S. Cl.
CPC ........ *A44C 5/2085* (2013.01); *G04B 37/1486* (2013.01); *H05K 999/99* (2013.01); *A44D 2203/00* (2013.01)

(56) References Cited

U.S. PATENT DOCUMENTS 2,408,279 A 9/1946 Valcourt
2,505,044 A 4/1950 Hainrich
2,518,551 A 8/1950 Jaccarino
2,775,861 A 1/1957 Fachon
3,165,884 A * 1/1965 Gwinner ................ G04B 37/14 224/164
3,293,714 A 12/1966 Kostanecki et al.
3,376,616 A 4/1968 Kaczorowski
3,589,341 A 6/1971 Krebs
3,675,284 A 7/1972 Rieth
3,747,171 A 7/1973 Montague, Jr.
4,068,355 A 1/1978 Rey
4,178,751 A 12/1979 Liautaud
4,217,681 A 8/1980 Grohoski et al.
4,234,115 A 11/1980 Williams
4,249,267 A 2/1981 Voss
4,401,388 A 8/1983 Mearns
4,414,714 A 11/1983 Kostanecki et al.
4,432,655 A 2/1984 Wollman
4,447,238 A 5/1984 Eldridge, Jr.
4,502,191 A 3/1985 Savage
4,615,185 A 10/1986 Bollinger
4,624,033 A 11/1986 Orton
4,648,161 A 3/1987 Rosen
4,941,236 A 7/1990 Sherman et al.
5,130,899 A 7/1992 Larkin et al.
5,146,437 A * 9/1992 Boucheron ........ G04B 37/1486 224/167
5,181,192 A 1/1993 Paratte
5,189,763 A 3/1993 Voumard
5,244,134 A 9/1993 Riley
5,305,503 A 4/1994 Yamagata
5,307,582 A 5/1994 Quitel
5,400,870 A 3/1995 Inoue
5,471,716 A 12/1995 Takahashi
5,522,529 A 6/1996 Yurman
5,668,784 A 9/1997 Iguchi
5,711,056 A 1/1998 Taguchi
5,788,400 A 8/1998 Wey
5,899,369 A 5/1999 Macripo
5,914,913 A 6/1999 Shriqui
5,930,873 A 8/1999 Wyser
5,991,978 A 11/1999 Nussbaum
6,014,793 A 1/2000 Howald
6,067,692 A 5/2000 Chang
6,163,938 A 12/2000 Weber-Unger
6,168,055 B1 1/2001 Grados
6,170,131 B1 1/2001 Shin
6,179,025 B1 1/2001 Sutton
6,292,985 B1 9/2001 Grunberger
6,311,373 B1 11/2001 Hashimoto
6,505,385 B2 1/2003 Grunberger
6,588,069 B2 7/2003 Deriaz et al.
6,598,271 B2 7/2003 Nire
6,606,767 B2 8/2003 Wong
6,631,669 B2 10/2003 Weldle
6,647,597 B2 11/2003 Reiter
6,678,898 B2 1/2004 Jones et al.
6,701,580 B1 3/2004 Bandyopadhyay
6,712,501 B2 3/2004 Kinkio
6,726,070 B2 4/2004 Lautner
6,746,058 B2 6/2004 Kienzler
7,243,824 B2 7/2007 Tabata
7,363,687 B2 4/2008 Kraus et al.
7,373,696 B2 5/2008 Schoening et al.
7,380,979 B2 6/2008 Hiranuma
7,451,527 B2 11/2008 Sima
7,451,528 B2 11/2008 Sima
7,509,712 B2 3/2009 Sima
7,526,840 B2 5/2009 Pemu et al.
7,640,632 B2 1/2010 Lazarus
7,806,309 B2 10/2010 Korchmar
7,882,601 B2 2/2011 Nguyen
7,900,754 B2 3/2011 Carlson
7,905,039 B2 3/2011 Karovic
8,091,261 B2 1/2012 Chadwick
8,191,209 B2 6/2012 Wolfgang
8,196,935 B2 6/2012 Lin
8,235,585 B2 8/2012 Speichinger
8,240,011 B2 8/2012 Chevrolet
8,261,416 B2 9/2012 Rothbaum et al.
8,316,515 B2 11/2012 Slank
8,471,658 B2 6/2013 Fullerton et al.
8,486,481 B2 7/2013 Giuseppin et al.
8,573,458 B1 11/2013 Hamilton
8,578,569 B1 11/2013 Karnoski et al.
8,615,849 B2 12/2013 Rothbaum
8,671,725 B2 3/2014 Nicoara
8,787,006 B2 7/2014 Golko et al.
8,789,246 B2 7/2014 Yliluoma et al.
8,844,100 B2 9/2014 Humphries
8,967,437 B2 3/2015 Wilson
9,003,611 B2 4/2015 Catanese
9,049,894 B2 6/2015 Wong
9,357,817 B2 6/2016 Lee et al.
9,392,829 B2 7/2016 Manuello
9,877,549 B2 1/2018 Perkins
2003/0116596 A1 6/2003 Terasawa
2005/0102802 A1 5/2005 Sitbon et al.
2005/0265132 A1* 12/2005 Ho .................... G04B 37/1486 368/282
2006/0156520 A1 7/2006 Meranto
2006/0186150 A1 8/2006 Willows et al.
2006/0254105 A1 11/2006 Chang
2007/0028429 A1 2/2007 Ishida
2009/0133438 A1 5/2009 Stampfli et al.
2009/0265832 A1 10/2009 Clement
2010/0200627 A1 8/2010 Shen
2010/0258601 A1 10/2010 Thrope
2011/0083254 A1 4/2011 Trutna et al.
2011/0226823 A1 9/2011 Jasa
2011/0309121 A1 12/2011 Dooley et al.
2012/0044031 A1 2/2012 Ninomiya
2012/0055212 A1 3/2012 Nicoara
2012/0216374 A1 8/2012 Manuello
2013/0086774 A1 4/2013 Krasinski et al.
2013/0205476 A1 8/2013 Gentile et al.
2013/0286796 A1 10/2013 Chatelain
2013/0305780 A1 11/2013 Christ
2013/0326790 A1 12/2013 Cauwels et al.
2014/0083133 A1 3/2014 Lee et al.
2015/0174854 A1 6/2015 Siahaan
2015/0181749 A1 6/2015 Gong
2016/0003269 A1 1/2016 Russell-Clarke et al.
2016/0010673 A1 1/2016 Russell-Clarke et al.
2016/0025119 A1 1/2016 Russell-Clarke et al.
2016/0037870 A1 2/2016 Perkins
2016/0037876 A1 2/2016 Perkins et al.
2016/0037877 A1 2/2016 Perkins et al.
2016/0037878 A1 2/2016 Yabe et al.
2016/0040695 A1 2/2016 Perkins et al.
2016/0040698 A1 2/2016 Perkins et al.
2016/0069371 A1 3/2016 Chen

(56) References Cited

U.S. PATENT DOCUMENTS

| | | | |
|---|---|---|---|
| 2016/0233034 | A1 | 8/2016 | Sheng |
| 2017/0181510 | A1 | 6/2017 | Novak |
| 2017/0265607 | A1 | 9/2017 | Hatanaka |
| 2018/0011448 | A1 | 1/2018 | Von Allmen |
| 2018/0090890 | A1 | 3/2018 | Kaliman |

FOREIGN PATENT DOCUMENTS

| | | | |
|---|---|---|---|
| CN | 1147358 | | 4/1997 |
| CN | 1181412 | | 5/1998 |
| CN | 3118417 | | 8/1999 |
| CN | 3184158 | | 4/2001 |
| CN | 3210240 | | 11/2001 |
| CN | 3229132 | | 3/2002 |
| CN | 2575724 | | 9/2003 |
| CN | 2706786 | | 6/2005 |
| CN | 200983868 | | 12/2007 |
| CN | 101535920 | | 9/2009 |
| CN | 201446979 | | 5/2010 |
| CN | 101843393 | | 9/2010 |
| CN | 201709560 | | 1/2011 |
| CN | 102202533 | | 9/2011 |
| CN | 202026953 | | 11/2011 |
| CN | 102282525 | | 12/2011 |
| CN | 202060129 | | 12/2011 |
| CN | 102392556 | | 3/2012 |
| CN | 102576213 | | 7/2012 |
| CN | 202587325 | | 12/2012 |
| CN | 202664274 | | 1/2013 |
| CN | 202704189 | | 1/2013 |
| CN | 202850585 | | 4/2013 |
| CN | 3329483 | | 12/2013 |
| CN | 103488076 | | 1/2014 |
| CN | 203435257 | U | 2/2014 |
| CN | 103670062 | A | 3/2014 |
| CN | 103802695 | | 5/2014 |
| CN | 103895602 | | 7/2014 |
| EP | 2098131 | | 9/2009 |
| EP | 2141554 | | 1/2010 |
| FR | 1291875 | | 4/1962 |
| FR | 2492238 | | 4/1982 |
| FR | 2532239 | | 3/1984 |
| GB | 464417 | | 4/1937 |
| GB | 865498 | | 4/1961 |
| GB | 1491532 | | 11/1977 |
| GB | 2113975 | | 8/1983 |
| GB | 2079359 | B | 11/1983 |
| GB | 2355281 | | 4/2001 |
| HK | 0501949.8 | | 8/2005 |
| HK | 1001605.7 | | 9/2010 |
| JP | S 60-178382 | | 9/1985 |
| JP | S 63-187913 | | 12/1988 |
| JP | H 06-62387 | | 9/1994 |
| JP | 3753756 | B | 3/2006 |
| JP | 2013254878 | | 12/2013 |
| TW | 440751 | | 6/2001 |
| TW | M380273 | U1 | 5/2010 |
| TW | 201336387 | A | 9/2013 |
| WO | WO 2010/036090 | | 4/2010 |
| WO | WO 2011/0048344 | | 4/2011 |
| WO | WO 2012/160195 | | 11/2012 |
| WO | WO 2013/140080 | | 9/2013 |

OTHER PUBLICATIONS

Author Unknown, "Tajan," http://www.tajan.com/pdf/7812.pdf , 2 pages, Dec. 10, 2007.
Author Unknown, "v2.0 Ikepod has landed . . . again . . . ," http://qp.granularit.com/media/38876/QP24_ikepod.pdf , 3 pages, at least as early as Apr. 25, 2015.
Author Unknown, Boucheron Paris, Reflect Collection, http://us.boucheron.com/en_us/the-creations/watches/reflet.html, 4 pages, at least as early as Apr. 10, 2015.
"Consumer Product Safety Act," (Public Law 92-573; 86 Stat. 1207, Oct. 27, 1972); https://www.cpsc.gov/PageFiles/105435/cpsa.pdf?epslanguage=en site visited on Apr. 27, 2018, 118 pages.
Chinese Office Action from Chinese Patent Application No. 201510485843.X, dated May 17, 2018, 17 pages including partial English language translation.
Chinese Office Action from Chinese Patent Application No. 201510490138.9, dated Jun. 5, 2018, 22 pages including partial English language translation.
International Search Report and Written Opinion, PCT/US2015/040692, 11 pages, dated Nov. 4, 2015.
International Search Report and Written Opinion, PCT/US2015/044391, 12 pages, dated Nov. 4, 2015.
International Search Report and Written Opinion, PCT/US2015/044392, 10 pages, dated Nov. 4, 2015.
European Office Action from European Patent Application No. 15180630.4 dated Apr. 24, 2019, 5 pages.
Chinese Office Action from 201510490182.X, dated Sep. 12. 2019, 10 pages including English language translation.

* cited by examiner

CONSUMER PRODUCT ATTACHMENT SYSTEMS HAVING A LOCKING ASSEMBLY

CROSS-REFERENCE TO RELATED APPLICATION

This application is a continuation of U.S. patent application Ser. No. 15/867,621, filed Jan. 10, 2018, which is a continuation of U.S. patent application Ser. No. 14/684,138, filed Apr. 10, 2015, which is a nonprovisional patent application of and claims the benefit to U.S. Provisional Patent Application No. 62/048,248, filed Sep. 9, 2014 and titled "Attachment Systems for Consumer Products," and U.S. Provisional Application No. 62/036,080, filed Aug. 11, 2014, and titled "Attachment Mechanism for an Electronic Device," the disclosures of which are hereby incorporated herein by reference in their entirety.

TECHNICAL FIELD

The present disclosure is directed to an attachment system for consumer products. More specifically, the embodiments described herein may be used to releasably couple an object to a consumer product.

BACKGROUND

Consumer products such as watches, cameras, phones, purses, and glasses may include one or more accessories attached thereto. The manner in which the accessories are attached may be widely varied. However, the attachment of these accessories suffer from similar if not the same drawbacks. For example, many consumer products typically do not include user-friendly attachment mechanisms. Furthermore, even when products have user oriented attachment mechanisms, they may not provide adequate retention force. Even if the retention force is adequate, the mechanism used may be quite robust and large thereby adversely affecting the elegance of the consumer product.

In one example, wristwatches typically include a case and a strap. The case carries the watch mechanisms including the watch face. The strap extends away from the case so that it can wrap around the wrist of a user. The strap may be integral with the case. However, in most cases, the strap is a separate part that is attached to the case. For example, the case may include a pin that captures the strap thereby attaching the strap to the case. In order to detach the strap from the case, the pin needs to be removed. In some instances, the user may need to visit a specialty store in order to have the pin and strap removed.

In another example, a pair of glasses, such as, electronic glasses, sunglasses and the like, may have temples or stems that extend from a frame. The temples or stems may be coupled to the frames by a screw, a pin or other such mechanism. However, it may be difficult to remove or replace the temples or stems without use of a specialized tool or without visiting a specialty store.

In still yet another example, other electronic devices may be coupled to a lanyard or other type of strap. For example a camera, a remote control, a game controller and the like may have a lanyard that is attached to a housing. However, it may be difficult to attach the lanyard to the housing as a portion of the lanyard is typically required to be inserted into a small opening within the housing. In this example, as with the other examples discussed above, the lanyard, accessory, object or article may not be attached to the electronic device or consumer product in a manner that is secure and aesthetically pleasing.

It is with respect to these and other general considerations that embodiments have been made. Although relatively specific problems have been discussed, it should be understood that the embodiments should not be limited to solving the specific problems identified in this background.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Provided herein is an attachment system for a consumer product. As will be explained in detail below, the attachment system may be used to couple an article, an object, an accessory and the like to the consumer product. For example, the object, article, or accessory may be a cover, a lanyard, a band, a strap, a dock and the like. Likewise, the consumer product may be an electronic device, a mechanical device, an electromechanical device and so on. Accordingly, the object may be securely coupled to the attachment system or removably coupled to the attachment system. The attachment system may then be removably coupled to the electronic device.

As also described herein, the object, the attachment system and the consumer product may comprise an ecosystem whereby each of the object, the attachment system and the consumer product are interchangeable with respect to one another. Thus, a single attachment system may be used with various objects, various attachment systems may be used with various consumer products and so on. In embodiments where the object is securely coupled to the attachment system, the attachment system and the object combination may be interchangeable with a replacement attachment system and object combination. In this manner, objects (such as bands) having different characteristics may be matched or used with a single consumer product, thereby allowing the band to be easily and efficiently changed or swapped. One band may be changed out for another to account for environmental differences, operational features, functional characteristics, appearance, and so on.

Additionally, the consumer product may be changed out such that multiple consumer products may be coupled to a given band, although not necessarily simultaneously. A band may be connected to a media player through an attachment system associated with on one or both of the band and media player, as one example. The media player may be removed from the band and a portable health monitor or timekeeping device may then be attached to the band using the same attachment system or a compatible attachment system.

The interoperability of bands and devices may be facilitated by a common attachment system. The attachment system may be received into a receiving module on a consumer product and may also be coupled to the band using a mating structure. By maintaining commonality of receiving modules across consumer products and commonality of mating structures across bands, interchangeability, functionality and choice may be enhanced. This may permit a variety of unique use cases, including using a band to physically connect two consumer products to one another presuming the band has a mating structure at both ends. Likewise, by providing a group of objects (bands, accessories, lanyards, charging mechanisms, data transfer mechanisms, cables, stands, supports, structures, and so on) that each have a common mating structure that may be utilized by the attachment system, and a group of consumer products that each have a common receiving module for receiving the attachment system, an ecosystem of objects and devices may be formed to provide increased choice, flexibility, operation and interoperability to a user.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1B:
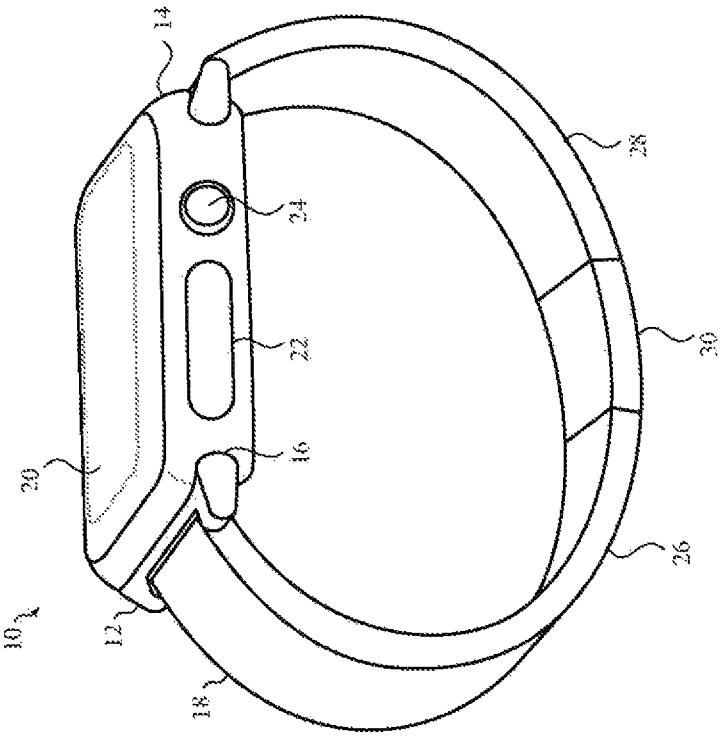
FIG. 1B illustrates an exemplary consumer product that includes an accessory according to one or more embodiments of the present disclosure.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Provided herein is an attachment system for a consumer product. The attachment system may include a removable module or an attachment unit that interfaces with some portion of the consumer product. For example, the removable module may engage with a related or corresponding module, recess, aperture or component of, or associated with, the consumer product. When engaged, the removable module may be carried by the consumer product. For example, when the removable module is engaged with the consumer product, the module and the consumer product may become an integrated unit. In some cases, the removable module can extend the functionality of the consumer product. That is, the attachment system and/or the removable module can provide additional operability to the consumer product. Additionally or alternatively, the removable module may be used as an accoutrement to the consumer product.

For example, the removable module may add an aesthetic or structural enhancement to the consumer product. Additionally or alternatively, the removable module may be configured to couple another object or article to the consumer product. For example, the object may be an accessory such as a cover, skin, plate, lanyard, band, strap, dock and/or the like. In all of these examples, the interface between the removable module and the consumer product may be a standard interface such that different functionality, accoutrements, and objects can be coupled to the consumer product.

The consumer product that may be used in conjunction with the attachment system can be widely varied. By way of example and not by way of limitation, the consumer product may be an electronic device, a mechanical device, an electromechanical device and the like. In one example, the consumer product is a portable consumer product. In another example, the consumer product is a wearable product. Additional and more specific examples of the consumer product include mobile phones, personal digital assistants, music players, timekeeping devices, health monitoring devices, tablet computers, laptop computers, glasses (electronic or otherwise), portable storage devices and the like. Although the examples above include electronic devices, the attachment system of the present disclosure may be used with non-electronic devices.

As will also be described below, the attachment system of the present disclosure typically includes a product side attachment assembly and a non-product side attachment assembly that can engage and disengage to and from one another. Each of these assemblies may, for example, include a lug portion that physically interface with one another in order to secure the two assemblies together. The assemblies may also releasably interface with one another in order to free the assemblies from each other.

In one embodiment, the attachment system includes a removable module that mechanically engages to and disengages from a component of the consumer product. The module may be coupled with and removed from the component of the consumer product. In one example, the component may be a housing or a portion of the housing of the consumer product. For example, the removable module may include a first lug portion configured for attachment to a second lug portion of the housing (or case) of the consumer product (e.g., a lug portion integrated with the housing). In another example, the component may be a module that is fixed to, recessed in, or extends from or is otherwise attached to the housing of the consumer product. For example, the removable module may have a first lug portion configured for attachment to a second lug portion, which is fixed to and extends from the housing (or case) of the consumer product. In another example, the first lug portion of the consumer product may be received into a recess or channel within the housing.

In one embodiment, the removable module of the attachment system may be configured to be inserted into an opening on the consumer product. The insertion may be a lateral insertion, a frontal insertion, and so on. Once the removable module, has been inserted into the opening, the removable module may slide within the opening of the consumer product. For example, the consumer product may have a channel that is disposed on one or more sides of a housing of the consumer product. The channel may be configured to follow the shape of the housing. Once the end portion of the removable module has been inserted into the channel, the removable module may slide further into the channel.

The sliding motion of the removable module may continue until the removable module is secured or otherwise coupled to or within the channel. Just as the removable module is configured to slide into the channel of the consumer product, the removable module may also slide out of the channel of the consumer product. Thus, the removable module may be easily inserted into and removed from the consumer product.

In other cases the removable module may be forwardly inserted into (or inserted straight into) the channel or opening of the housing. For example, the removable module may be inserted into a front face of the channel or other such opening in a housing and be secured in place using one or more securement mechanisms in or on the channel and/or in or on the removable module.

In another embodiment, the attachment system may be shaped to mechanically interlock with the consumer product. In such embodiments, a removable module of the attachment system may have a first shape that corresponds to a shape of a receiving module that is associated with or part of the consumer product. For example, the length, width, height, shape and other dimensions of the removable module may similar to or otherwise correspond with the length, width, height and shape of the receiving module. As such, when the removable module is placed within the receiving module of the consumer product, the removable module is integrated (either partially or entirely) with the consumer product.

In one embodiment, the attachment system includes a locking mechanism. The locking mechanism may be integrated with the removable module of the attachment system. Further the locking mechanism may be configured to interact with the receiving module of the consumer product. As such, as the removable module is inserted into the receiving module of the consumer product, the locking mechanism interfaces with a portion of the receiving module to lock or otherwise secure the removable module within the receiving module.

The locking mechanism may also be configured to interface with a releasing mechanism associated with the receiving module. The releasing mechanism, or a portion of the releasing mechanism, may be part of, or integrated with, the receiving module. As such, when the locking assembly has been received into the receiving module, the releasing mechanism may be actuated. Actuation of the releasing mechanism causes the locking mechanism to be removed from the portion of the receiving module and enables the removable module to slide within the receiving module.

In other cases, the locking mechanisms may be contained within the housing of the consumer product. As such, the housing may be configured to insert at least a portion of a locking mechanism into a receiving aperture of the removable module. Accordingly, the removable module may be configured to trigger a release of the locking mechanism from the receiving aperture of the removable module.

In addition to the above, the attachment system of the present disclosure may have various other components and modules that enables the removable module to engage with and be disengaged from the consumer product. For example the attachment system may have various pads disposed on a surface of the removable module to assist or otherwise enable the removable module to slide within the receiving module of the consumer product. The pads may also be used to prevent undesired movement of the removable module once the removable module has been locked within the receiving module and maintain spacing between the removable module and the receiving module.

The attachment system may also be used to secure various accessories to the consumer product. For example, an accessory, article or object may be coupled or otherwise attached to the removable module of the attachment system. Further, the accessory, article or object may be used to secure the consumer product to a user. For example, the attachment system may be removably coupled to a housing or a receiving module of the consumer product.

The consumer product may be configured to receive multiple different bands, accessories and the like. The consumer product, and the associated bands, may each include a common node that couples to a corresponding node associated with the consumer product. Accordingly, the consumer product may have a plurality of accessories or bands that may be interchangeable thereby providing a user many different aesthetic looks for the consumer product. More specifically, the consumer product may be configured to receive a first band, and second band which is different than the first band. Further, each of the first band and the second band may include a common node that couples to, or is received by, a corresponding node in the consumer product. Thus, each band may be interchangeable with respect to one another and with other bands and/or accessories.

Furthering the example from above, a band or strap may be removably coupled to the attachment system and may further be used to secure the consumer product to the user. Because the attachment system is removably coupled to both the housing of the consumer product and a band or strap, the attachment system itself, or the band or strap, may be interchangeable with numerous other bands having different materials, designs and configurations.

In one particular embodiment, the consumer product is a portable electronic device. More specifically, the consumer product is may be a wearable consumer product. A wearable consumer product is one that can be worn by or otherwise secured to a user. For example, the wearable electronic device may include, but is not limited to a wearable computer, a wearable watch, a wearable communication device, a wearable media player, a wearable health monitoring device, and/or the like. In cases such as these, the attachment system may be used to couple a band, a strap, a sleeve or various types of clothing to the wearable consumer product. For example, in the case of a wrist worn product, the removable module of the attachment system may carry a band that can be wrapped around and secured to a user's wrist when the removable module is attached to the wearable product. It should be appreciated, however, that the above examples are not limitations.

In certain embodiments, the band, the attachment system and/or portions of each may be made up of a variety of different materials and/or configurations. In certain embodiments, the band and/or the attachment system, may be made from rubber, metal, woven fiber, leather, rubber overlaying a woven mesh, silicon, Milanese mesh, and so on. In some embodiments, a first band, or a first portion of a first band may be made up of a first material and a second bad, or a second portion of the first band, may be made from a second different material. The band may also be made up of a plurality of links with the attachment system forming one or more of the links. As such, the band may be resizable by, for example, adding or removing links.

In some embodiments, the bands may be coupled to respective attachment systems using pins, holes, adhesives, screws, and so on. In yet other embodiments, the band may be co-molded or overmolded with at least a portion of the attachment mechanism.

These and other embodiments are discussed below with reference to the figures. However, those skilled in the art will readily appreciate that the detailed description given herein with respect to these figures is for explanatory purposes only and should not be construed as limiting.

Figure 1A:
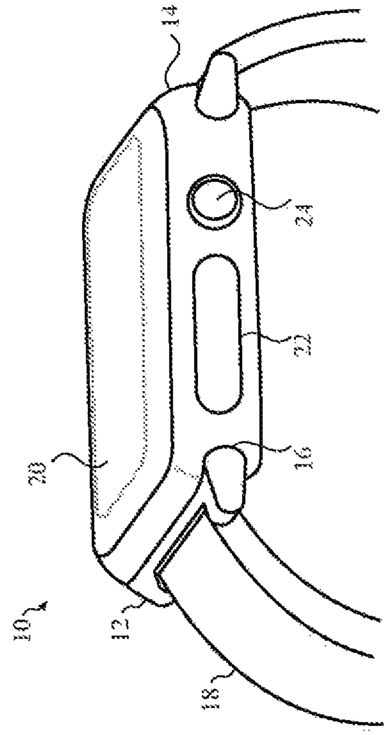
FIG. 1A illustrates an exemplary attachment system of a consumer product configured to removably receive an attachment unit according to one or more embodiments of the present disclosure.

FIG. 1A illustrates an exemplary consumer product 10 that may be used with an attachment unit 12 of an attachment system according to one or more embodiments of the present disclosure. The consumer product 10 may include a base unit (shown in FIG. 1A as a housing 14) and one or more attachment units (shown in FIG. 1A as attachment unit 12) capable of being removably coupled to the housing 14. The housing 14 may, for example, include a coupling node (shown in FIG. 1A as channel 16) that mechanically engages a corresponding coupling node on the attachment unit 12. The coupling nodes may be widely varied. The coupling node on the housing 14 includes an opening while the coupling node on the attachment unit 12 includes a lug that fits within the opening. The opening may be configured in a variety of different shapes and orientations. Further, the opening is configured to removably receive the lug such as will be described in detail below.

The attachment unit 12 may be laterally inserted into the housing 14 of the consumer product 10. As such, the attachment unit 12 may be configured to slide relative to the housing 14 of the consumer product 10. In other embodiments, the attachment unit 12 may be pressed, snap fit or otherwise forwardly inserted into the channel 16 of the housing 14. Once inserted, the attachment unit 12 may be locked or otherwise secured within the housing 14.

In some embodiments, the attachment unit 12 may include a rounded body and one or more arms that extend from the body. This shape of the body may be a teardrop shape. In other embodiments, the shape of the body may be rectangular, square or other such shape. The arms may have substantially planar outer side surfaces that flare outwardly from a first end to a second rounded end. In another embodiment, the top and/or bottom surface of the body may be flat or substantially flat and have at least one rounded side wall that transitions from the flat top surface to the flat bottom surface. In other configurations, the surfaces of the body may be flat or substantially flat. More specifically, a top surface of the body may be rounded and also have one rounded sidewall (or front portion) that transitions to a bottom surface. As will be explained below, one or more locking assemblies may extend from the bottom surface, the top surface and/or the rounded surface. In other implementations, the top surface, the bottom surface and/or the rounded surface may have one or more recesses that are used to receive a locking assembly.

Although not shown, the attachment unit 12 may include one or more friction pads. The friction pads may be positioned on both the bottom surface of the body and the top surface of the body. Further, the friction pads may be positioned on either side of the locking assembly. In other embodiments, the friction pads may not be present.

In certain embodiments, the attachment unit 12 includes arms that extend from the body. The arms of the attachment system may have a width that starts narrow at one end and gets wider the closer the arms get to the body of the attachment unit 12. That is, the arms may have a narrow width at a proximal end and have a wider width as the arms are integrated with the body. In some embodiments, each arm may have a sidewall that extends along the outside of the attachment unit 12 that make up a width of the attachment unit 12. In some embodiments, the arms may be joined by a bar that creates an opening such as shown below. The opening may be used to receive a band or other accessory.

In some embodiments, the sidewalls of each arm (whether separate or integrated) may be angled and/or tapered. More specifically, the sidewall of each arm may be angled or slanted from the top surface of the body toward the bottom surface of the body.

Although the attachment unit 12 may be locked in place within the housing 14, actuation of a button assembly (e.g., button assembly 34 of FIG. 1D) or other types of actuators on the housing 14 release the attachment unit 12 which enables the attachment unit 12 to be removed from the housing 14. In some embodiments, the button assembly 34 (FIG. 1D) may be disposed on an underside (32 of FIG. 1D) of the housing 14. In other embodiments, the button assembly 34 (FIG. 1D) may be disposed or positioned on a top side of the housing 14. Further, the button assembly 34 may be placed at various locations on the underside and/or the top side of the housing 14. In some cases, the actuator or button assembly that is used to release the attachment unit 12 from the housing 14 may be located on the attachment unit 12. In some cases, an applied force on the attachment unit 12 in a particular direction may cause the locking assembly to retract or otherwise release the attachment unit 12 from within the housing 14 such as will be described below.

Although a single attachment unit 12 is discussed, a plurality of attachment units 12 may be coupled to the consumer product 10. For example, as shown in FIG. 1A, an attachment unit 12 may be coupled to a first side of the consumer product 10 and a second attachment unit 12 may be coupled to a second side of the consumer product 10.

When multiple attachment units 12 are used, the consumer product 10 may have a channel 16 or other such coupling node on a first side of the housing 14 and a second channel 16 or other such coupling node on a second side of the housing 14. The channel 16 on the first side of the housing 14 of the consumer product 10 may receive one of the attachment units 12 and the channel 16 on the second side of the housing 14 of the consumer product 10 may receive another attachment unit 12. Further, each of the attachment units 12 may be inserted into their respective channels 16 such as described above.

Each attachment unit 12 may have a specific shape, size or orientation based on the channel 16 the attachment unit 12 is to be inserted into. For example, a first attachment unit 12 may have a circular orientation and/or a first size that corresponds to a shape and/or size of the channel 16 on the first side of the housing 14 of the consumer product 10. Likewise, a second attachment unit 12 may have a second size and/or shape that corresponds to a shape and/or size of the channel 16 on the second side of the housing 14 of the consumer product 10. In other embodiments, each attachment unit 12 may have the same shape and/or size and can therefore be interchangeable with respect to one another.

In addition to the above, the first attachment unit 12 may be coupled to the consumer product 10 while the second attachment unit 12 is detached or removed from the consumer product 10. Likewise, the second attachment unit 12 may be coupled to the consumer product 10 while the first attachment unit 12 is removed from the consumer product 10. The first attachment unit 12 may be configured to receive a first accessory, object or article or type of accessory, object or article. Likewise the second attachment unit 12 may be configured to receive an accessory, object or article that is similar to, or different from, the accessory, article or object that is coupled to the first attachment unit 12.

The channel 16 may include a recess or other opening that is configured to receive a locking assembly of the attachment unit 12. In some embodiments, the recess may be disposed on a single side of the channel 16 or on multiple sides of the channel 16. In some cases, the channel 16 may include various grooves that are configured to mate with protrusions or ribs disposed on the attachment unit. In other cases, the channel 16 may include ribs or other protrusions that are configured to mate with corresponding grooves or striations on the attachment unit 12.

In some embodiments, the recess is positioned within the channel 16 such that the locking assembly of the attachment unit 12 is aligned with the recess when the sides of the locking assembly are flush or substantially flush with respect to the channel 16 and/or one or more sidewalls of the housing 14. For example, the channel 16 of the housing 14 is configured to receive either a proximal end or a distal end of the attachment unit 12. Once either the proximal end or the distal end of the attachment unit 12 has been received by the channel 16, the attachment unit 12 may slide or move within the channel until the locking mechanism of the attachment unit 12 expands into, engages with, or otherwise enters, the recess contained within the channel 16. In embodiments in which the locking assembly is contained within housing 14 or the channel 16, the attachment unit 12 may be inserted into the channel 16 or otherwise move within the channel 16 until the locking assembly of consumer product 10 is received into a locking recess disposed on the attachment unit 12.

To release the attachment unit 12 from the channel 16, a button assembly (e.g., button assembly 34 of FIG. 1D) associated with the housing 14 is actuated (or a button assembly 34 on the attachment unit 12 is actuated in embodiments where the locking assembly is contained in the housing 14). Actuation of the button assembly 34 expels the locking assembly from the recess and enables the attachment unit 12 to once again freely move or slide within the channel 16 of the housing 14 or be pulled out from the front face of the channel 16.

As briefly discussed above, one or more accessories 18, objects or articles may be coupled to each attachment unit 12. More specifically, each accessory 18 may be removably coupled to the consumer product 10 using one or more of the attachment units 12.

In another example, each accessory 18 that is coupled to a respective attachment unit 12 may be different structures or part of the same structure. As such, one end of the accessory 18 may be removably coupled to the attachment unit 12 while a second end of the accessory 18 may be coupled to another accessory 18 or to a user. In some embodiments, the accessory 18 may be integrated with the attachment unit 12. As such, the accessory 18 may not be removable from the attachment unit 12. In such instances, the attachment unit 12 and accessory combination may be interchangeable with a different attachment unit 12 and accessory combination.

The accessory 18 may be interchangeable with respect to the attachment unit 12. Thus, the accessory 18, the attachment unit 12 and the housing 14 of the consumer product 10 (or the consumer product 10 itself), and various combinations thereof, may comprises an ecosystem whereby each component of the ecosystem may be interchangeable with respect to one another. For example, one attachment unit 12 may be used with various accessories. In another embodiment, various attachment units 12 may be used with a single consumer product 10. In yet another embodiment, a single accessory 18 and/or a single attachment unit 12 may be used in various consumer products 10.

In some embodiments, the attachment unit 12 may be coupled to the consumer product 10 or secured within the receiving component of the consumer product 10 using a clasp or other attachment means such as, for example, magnets, snaps, and the like. In other embodiments, the accessory 18 may be secured, coupled or otherwise attached to the attachment unit 12 using a variety of attachment means. Examples of such include, but are not limited to a clasp, a removable pin, magnets, snaps, and other such attachment means. In other embodiments, the accessory 18 may be secured to the attachment unit 12 by being overmolded to, woven onto, or otherwise integrated with the attachment unit 12.

The consumer product 10 may be widely varied. In some embodiments the consumer product 10 may be a wearable consumer product 10. Additionally or alternatively, the consumer product 10 may be an electronic device. In yet other embodiments, the consumer product 10 may be a portable computing device. Examples include cell phones, smart phones, tablet computers, laptop computers, timekeeping devices, computerized glasses and other wearable devices navigation devices, sports devices, accessory devices, health-monitoring devices, medical devices, wristbands, bracelets, jewelry, and/or the like.

In one example and as shown in FIG. 1A, the consumer product 10 may be a wearable multifunctional electronic device. The wearable multifunctional electronic device may have various functionalities and/or capabilities described above (e.g., computing, communication, timekeeping or time display, health monitoring, health tracking and/or health output functionalities/capabilities, etc.). In another example, the consumer product 10 is a wrist worn multifunctional device and may include various components and/or modules In another example, the consumer product 10 may act as an extension of another electronic device (or vice versa). For example, if the consumer product 10 is configured as a wrist worn device, it may serve as a watch like device that can interact with a phone that is carried by (e.g., in a pocket) or otherwise associated with the user.

The consumer product 10 may include a housing 14. The housing 14 serves to surround a peripheral region of the consumer product 10 as well as support the internal components of the consumer product 10 in their assembled position. That is, the housing 14 may enclose and support various internal components (including for example integrated circuit chips, processors, memory devices and other circuitry) to provide computing and functional operations for the consumer product 10. The housing 14 may also help define the shape or form of the consumer product 10. That is, the contour of the housing 14 may embody the outward physical appearance of the consumer product 10. As such, it may include various ornamental and mechanical features that improve the aesthetical appearance and tactile feel of the device. The housing 14 may be formed as a single piece, which may enhance the structural rigidity, water impermeability, and manufacturability of the housing 14.

For example, as shown in FIG. 1A, the housing 14 may have a rectilinear shape although other shapes are contemplated. The housing 14 may also have a substantially planar or flat top surface on which a display 20 may be positioned and a substantially planar or flat bottom surface. Although the top surface of the housing 14 and the bottom surface of the housing 14 may be substantially planar, the transition between the top surface of the housing 14 and one or more sidewalls of the housing may be curved. Put another way, the transition from the top surface to the one or more sidewalls of the housing (e.g., including a side in which the channel 16 is positioned) may be rounded such that a smooth transition is present between the top surface and the sides of the housing 14. Likewise, the transition from the bottom surface of the housing 14 to one or more sidewalls of the housing 14 may have a similar rounded shape and transition. In some cases, the shape of the housing may be rounded. In such embodiments, the channel 16 may also be rounded.

The housing 14 and the attachment unit 12 may be formed of plastic, glass, ceramics, fiber composites, metal (e.g., stainless steel, aluminum, etc.), other suitable materials, or a combination of these materials. Further, the surface of the housing 14 and the attachment unit 12 may be formed from any suitable material, including aluminum, steel, gold, silver and other metals, metal alloys, ceramics, wood, plastics, various types of glass and combinations thereof, and the like.

The consumer product 10 may include various components that may be disposed on the outside of the housing 14, within the housing 14, through the housing 14, inside the housing 14 and so on. For example, the housing 14 may include a cavity for retaining components internally as well as holes or windows for providing access to the various internal components. The housing 14 may also be configured to form a water-resistant or water-proof device. For example, the housing 14 may be formed from a single body and the openings in the body may be configured to cooperate with other components to form a water-resistant or water-proof barrier.

In some embodiments, one of the components included in the consumer product 10 may be one or more I/O systems. For example, the consumer product 10 may include a display 20 configured to output various information about the consumer product 10. The display 20 may also output data from applications and other programs that are being executed by the consumer product 10. For example, the consumer product 10 may provide information regarding the current time, health of a user, status notifications, notifications or messages received from externally connected devices or communicating devices and/or software executing on such devices. The consumer product 10 may also provide information about applications or otherwise display messages, video, operating commands, and so forth that are executing on the consumer product 10.

The display 20 of the consumer product 10 may also be configured to receive input. For example, the display 20 may be a touch screen display that incorporates capacitive touch electrodes. In embodiments where the display 20 is configured to receive input, the display 20 may have an input area. The input area may cover the entire display 20 or substantially all of the display 20. In another embodiment, the input area may cover only a portion of the display 20. Further, the display 20 may be a multi-touch display that is configured to receive and process various contact points received on the display.

The display 20 may include image pixels formed from light-emitting diodes (LEDs), organic LEDs (OLEDs), plasma cells, electronic ink elements, liquid crystal display (LCD) components, or other suitable image pixel structures. The shape, size and dimensions of the display 20 may also vary. For example, the display 20 may be planar or substantially planar. In other embodiments, the display 20 may be concave or convex. The display 20 may be shaped to cover or substantially cover a top portion of the housing 14. As such, the display 20 may have a shape that is similar to the shape of the housing 14. In other embodiments, the shape of the display 20 may differ from the shape and/or size of the housing 14.

The consumer product 10 may also have other input and output mechanisms. For example, the consumer product 10 may include or interface with one or more buttons 22, a crown 24, keys, dials, trackpads, microphones and the like. Each of these input mechanisms may be disposed on a top surface of the housing 14, a bottom surface of the housing 14 and/or on one or more sidewalls of the housing 14. The consumer product 10 may also include one or more speakers, headphone jacks and the like.

The consumer product 10 may also be configured to provide haptic output, audio output, visual output or combinations thereof. With respect to the haptic output, the consumer product 10 may have one or more haptic actuators that are configured to provide the haptic output. The haptic output, and other forms of output provided above, may vary based on a variety of factors. Some of these include, but are not limited to, how the consumer product 10 is being used, which applications are being executed, the information that is output on the display 20 and the like. For example, if the consumer product 10 is monitoring the health of the user, a first type of haptic output may be provided. Alternatively or additionally, if the consumer product 10 is being used as a time keeping device, a second type of haptic output may be provided. In yet another example, if a warning or message is output on the display 20, the warning or message may include a haptic output, visual output and an auditory output.

The type, feel and duration of the haptic output, the audio output and/or the visual output may also vary. For example, the type, feel and duration of the haptic output of the consumer product 10 based on an orientation of the consumer product 10 and/or a location or position of the consumer product 10 (e.g., with respect to a user, environmental conditions, whether the consumer product 10 is outside or inside and the like).

In addition to the above, the attachment unit 12 itself, or portions of the attachment unit 12, may be configured to provide and/or enhance haptic feedback. For example, the attachment unit 12 may have a haptic actuator disposed in an inner portion. In another embodiment, the accessory 18 that is coupled to the attachment unit 12 may be used to enhance and/or provide haptic output. In yet another embodiment, a haptic actuator disposed in the consumer product 10 may cause the attachment unit 12, or a portion of the attachment unit 12, to resonate or amplify the haptic output that is provided by the haptic actuator.

The consumer product 10 may include a connection system, either wired or wireless, that enables the consumer product to interface with other devices. These other devices may include laptop computers, mobile phones, tablet computers, exercise equipment, electronic glasses and the like.

The consumer product 10 may also include various other operating components (potentially housed with the housing 14). These components may include a processor, a memory, a communication system, an antenna and the like. For example, the consumer product 10 may include a processor coupled with or in communication with a memory. The consumer product 10 may also include one or more communication interfaces, The communication interface(s) can provide electronic communications between the communications device and any external communication network, device or platform, such as but not limited to wireless interfaces, Bluetooth interfaces, Near Field Communication interfaces, infrared interfaces, USB interfaces, Wi-Fi interfaces, TCP/IP interfaces, network communications interfaces, or any conventional communication interfaces.

The consumer product 10 may also include various sensors. These sensors may include and are not limited to, biometric sensors, gyroscopes, accelerometers, light sensors, optical sensors, global positioning sensors, and so on. These sensors may assist with or otherwise provide functionality to the consumer product 10. In addition, readings from these sensors may be analyzed by the consumer product 10 and/or may be transmitted to a companion device or other product.

The consumer product 10 may be a wrist worn device that utilizes bands or straps for attaching the consumer product 10 to a wrist. In such embodiments, the consumer product 10 may have a band that is coupled to each side of the consumer product 10. Further, each band may engage with or disengage with the attachment unit 12 located on respective sides of the consumer product 10.

For example, as shown in FIG. 1B, the band (or accessory 18) may include a first band strap 26 attached to a first attachment unit 12 of the consumer product 10 and a second band strap 28 attached to a second attachment unit 12 of the consumer product 10. In some embodiments, free ends of the first band strap 26 and the second band strap 28 may be configured to be releasably attached or secured to one another using a clasp 30 or other attachment mechanism to form a loop. This loop may then be used to attach the consumer product 10 to a user's wrist.

The first band strap 26 and the second band strap 28 may be formed from various materials that are suited for various applications. For example, the first band strap 26 and the second band strap 28 may be formed from leather, woven textiles, or metallic mesh materials. The materials and construction of the first band strap 26 and the second band strap 28 may depend on the application.

For example, the first band strap 26 and the second band strap 28 may be formed from a woven textile material configured for exposure to impact and moisture typically associated with outdoor activities. In another example, the first band strap 26 and the second band strap 28 may be formed from a metallic mesh material that may be configured to have a fine finish and construction that may be more appropriate for professional or social activities.

The clasp 30 may also be configured for a particular application and/or selected based on a particular style of band. For example, if the first band strap 26 and the second band strap 28 are formed from a metallic mesh material, the clasp 30 may include a magnetic clasp mechanism.

In other embodiments, the accessory 18 may be a unitary accessory. In such embodiments, a distal end of the accessory 18 may be configured to be coupled to a first attachment unit 12 and a proximal end of the accessory may be configured to be coupled to a second attachment unit 12. In yet another example the accessory 18 may be coupled directly to, or may be manufactured to contain, a removable module. That is, the accessory 18 may designed to include a feature that is configured to slide within the housing 14 of the consumer product 10

For example, the proximal end and/or the distal end of the accessory 18 may have a locking assembly that acts to secure the ends of the accessory 18 within the channel 16 of the housing 14. In addition, the ends of the accessory 18 may include one or more protrusions or friction pads such as described herein. Further, the proximal end and/or the distal end of the accessory may be made from various materials including silicon, metal, and so on.

Figure 1D:
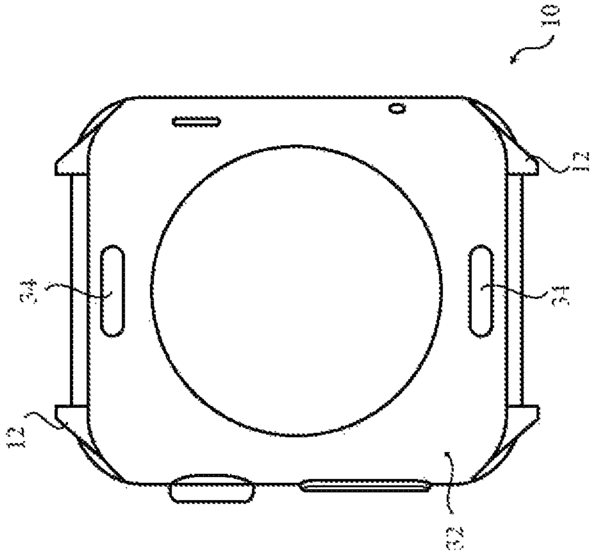
FIG. 1D illustrates a bottom view of the consumer product of FIG. 1A according to one or more embodiments of the present disclosure.
Figure 1C:
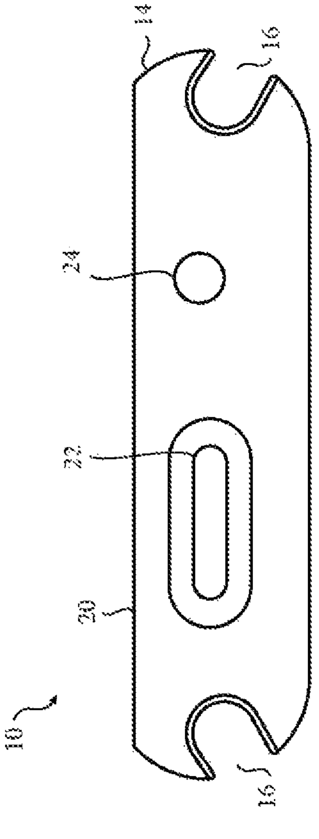
FIG. 1C illustrates a side view of the consumer product of FIG. 1A according to one or more embodiments of the present disclosure.

FIG. 1C illustrates a side view of the consumer product 10 of FIG. 1A according to one or more embodiments of the present disclosure. The housing 14 may have a three dimensional shape that is generally rectilinear. Although a rectilinear shape is shown and described, the housing 14 may be rounded, square, oval, arced, triangular, and have other such shapes.

In example depicted in FIG. 1A, the housing 14 can be described as having two ends (a first end and a second end opposite the first end), and a first side and a second side opposite the first side, the sides being continuous with the ends. In this example, the first end and the second end and the first side and the second side have an outwardly curved three-dimensional shape.

In some embodiments, a top side and a bottom side of the housing 14 may be substantially planar or flat. A display 20 may be positioned on the top side of the housing 14. When the display 20 ends, the housing 14 may transition from a flat or planar surface into one or more rounded edges. The rounded edges provide a smooth transition from the top side of the housing 14 to a sidewall of the housing 14 and from a sidewall of the housing 14 to a bottom side of the housing 14. The rounded edges of the housing 14 may cause a side profile of the housing to have a general lozenge shape although other shapes are contemplated.

In the example shown in FIG. 1C, the channel 16 is formed in the first end. Similarly, a second channel 16 is formed in the second end. In the present example the channels 16 have openings at the interface of the first and second sides and first and second ends. As also shown in FIG. 1C, the channel 16 of the housing 14 may be disposed on one or more sidewalls of the housing 14. Thus, as the rounded edges transition from the top surface to the bottom surface of the housing 14, the rounded edges may transition into the channel 16 itself. That is, the channel 16 may be carved directly into a solid portion of the housing 14. As such, the channel 16 may be positioned below the display 20 of the consumer product 10.

In some embodiments, the channel 16 may also have an inwardly curved three-dimensional shape with an undercut. For example, the channel 16 may have a width that is greater than the openings on a proximal end and/or a distal end of the channel 16. In some embodiments, the upper portion of the housing 14 overhangs the lower portion of the housing 14 at the channel 16 opening. In the example depicted in FIG. 1C, the channel 16 is cut into a solid portion of the housing 14 such that the channel 16 forms a continuous interior shape. As discussed above, the attachment unit 12 may have a shape and other dimensions that mirror those of the channel 16 and/or the housing 14.

In some embodiments, the channel 16 is formed at an angle relative to the centerline of the housing 14. In some embodiments, the channel 16 is located underneath a centerline of the housing 14. In some embodiments, the channel 16 is angled upward and inward within the profile of the housing 14, such that the channel 16 crosses a vertical centerline of the housing 14. In some embodiments, the channel 16 may be angled with respect to a centerline of the housing 14 at approximately five degrees or greater.

The channel 16 may be configured in a variety of shapes. For example, the channel 16 may be rounded such as shown in FIG. 1C. In other embodiments, the channel 16 may be rectilinear or have other shapes.

The channel 16 may also have an opening at a proximal end and another opening at a distal end. As discussed above, the channel 16 may extend along a side of the housing 14 such that the openings at each end are connected. In addition, the channel 16 may be shaped such that a lateral opening of the channel 16, as well as the proximal end and the distal end of the channel 16 follow the contour of the housing. As such, the openings may be slanted or otherwise curved based on the shape and dimensions of the housing 14. The openings may be on a curved surface and/or located inward of an outer dimension of the consumer product 10.

In some embodiments, the channel 16 may be shaped such that the openings at the proximal end and the distal end are slightly tapered. As the channel 16 progresses toward the center of the channel 16, the depth of the channel increases. Put another way, near the open ends of the channel 16, the channel 16 may have a shallow depth and as the channel 16 progresses within the housing 14, the depth of the channel increases. As each opening may be configured to receive an accessory (e.g., accessory 18) and/or an attachment unit 12 such as described above, the configuration of the channel 16 in this manner may assist in enabling the attachment unit 12 or accessory 18 to enter the channel 16.

In addition to the openings at the proximal ends and the distal end of the channel 16, a lateral slot may extend between the proximal end and the distal end of the channel 16. The lateral slot may provide space for an object to pass through the housing which enables the object to be attached to an attachment unit 12 contained within the channel 16 or otherwise be secured to the housing 14.

In some embodiments, the lateral slot may also be tapered or have a dimension that is narrower than the dimensions of the openings at each of the ends. That is, the proximal end and the distal end of the channel 16 may have a first dimension while the lateral slot of the channel 16 has a second dimension. In some embodiments, the second dimension is smaller than the first dimension. This configuration may help prevent forward insertion and/or removal of an accessory 18 and/or attachment unit 12 that are contained within the channel 16. For example, due to the narrower dimension of the lateral slot, an accessory 18 or attachment unit 12 may be prohibited from being pulled out of the front of the slot due to an applied "pulling" force on the attachment unit 12 or accessory 18. The lateral slot of the housing 14 may also be comprised of a rigid material which prevents or helps prevent the housing 14 from bending, expanding and so on.

FIG. 1D illustrates a bottom view of the consumer product 10 of FIG. 1A according to one or more embodiments of the present disclosure. In some embodiments, the bottom side 32 of the housing 14 may be flat or substantially flat such as described above. In addition, the bottom side 32 of the housing 14 may include a button assembly 34. In certain embodiments, the button assembly 34 is aligned with a recess in the channel 16. As discussed above, the button assembly 34 may be used to release a locking assembly of the attachment unit 12 from the channel 16.

Although FIG. 1D shows the button assembly 34 centrally positioned near the sides of the housing 14, the button assembly 34 may be positioned anywhere on the bottom side 32 of the housing 14. In addition, each side of the housing 14 may include a single button assembly 34 or multiple button assemblies 34. Further, although the button assembly 34 is shown on the bottom side 32 of the consumer product 10, the button assembly 34 may be positioned on a sidewall of the housing 14, a top side of the consumer product 10 and/or on the attachment unit 12.

As also shown in FIG. 1D, when the attachment unit 12 is inserted into the channel 16, the attachment unit 12 is contained within the channel 16. Thus, when the attachment unit 12 is contained within the channel 16, the attachment unit 12 may complete or otherwise fill the groove in the periphery of the housing 14 caused by the channel 16. As shown in FIG. 1D, one or more arms of the attachment unit 12 may extend from the channel 16. The arms may be used to secure an accessory 18 to the housing 14 such as described above.

The following description and their associated figures are directed to various attachment systems, attachment units, channels and/or housings that may be used by or otherwise integrated with a consumer product. In some cases, the attachment system includes a receiving mechanism on the consumer product and a lug or other such attachment unit that is configured to be removably received by the receiving mechanism. As such, the various attachment units described below may be similar to the attachment unit 12 described above. In addition, the housings, channels and consumer products described below may be similar to the housing 14, the channel 16 and the consumer product 10 described above. Further, each attachment unit 12 may be configured to be coupled to a band, a strap or other accessory such as described above. It is also contemplated that the various embodiments describe below may be combined in a variety of ways and are not limited to the illustrated embodiments.

Figure 2A:
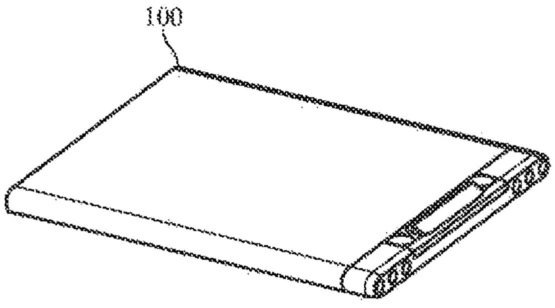
FIG. 2A illustrates an attachment unit with a locking assembly according to one or more embodiments of the present disclosure.

FIG. 2A illustrates an exemplary attachment unit 100 according to one or more embodiments of the present disclosure. In some embodiments, the attachment unit 100 may include or be integrated with a band such as shown. In other embodiments, the band may be removably coupled to the attachment unit 100. The attachment unit 100 may have a linear or curved configuration and be configured for lateral insertion or forward insertion into a groove or channel of a housing of a consumer product such as shown and described with respect to FIG. 2C FIG. 2F.

Figure 2B:
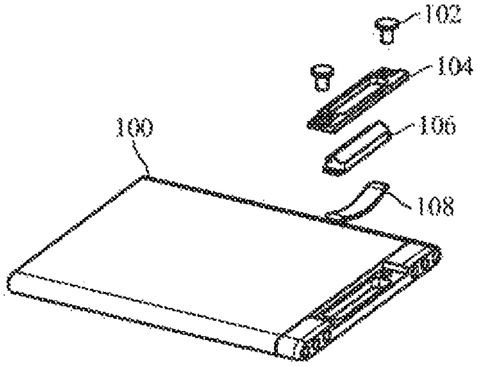
FIG. 2B illustrates an exploded view of the locking assembly of the attachment unit of FIG. 2A according to one or more embodiments of the present disclosure.

Once the attachment unit 100 has been inserted into the housing 110 a spring biased locking assembly of the attachment unit 100 may secure the attachment unit 100 in place within the channel of the housing. For example and referring to FIG. 2B, the locking assembly of the attachment unit 100 may include a spring 108, a catch member 106, a bracket portion 104 and one or more securement mechanisms 102 that secure the locking assembly to the attachment unit 100.

Figure 2C:
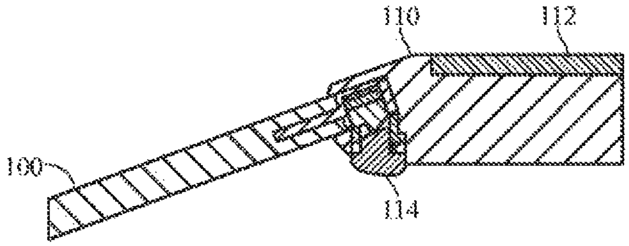
FIG. 2C illustrates a cross-section view of the attachment unit of FIG. 2A being inserted into a housing of a consumer product according to one or more embodiments of the present disclosure.

In this particular embodiment, the catch member 106 may be coupled to the spring 108 which causes a portion of the catch member 106 to protrude from a surface of the attachment unit 100. The spring 108 also enable the catch member 106 to move in an upward and downward manner within the attachment unit 100 in response to received pressure. For example, when the attachment unit 100 is inserted into a channel of a housing such as shown in FIG. 2C, the spring 108 enables the catch member 106 to retract into the attachment unit 100. More specifically, if the attachment unit 100 is forwardly inserted (or laterally inserted) into a channel of the housing 110, contact between the catch member 106 and the housing causes the catch member 106 to retract. Once the attachment unit has been inserted into the channel and the catch member 106 is in proximity to the recess within the channel, the spring 108 causes the catch member 106 to be received into the recess thereby locking the attachment unit 100 within the housing.

Referring to FIG. 2C, FIG. 2C illustrates a cross-sectional view of the attachment unit 100 being inserted into a housing 110 of a consumer product. In some embodiments, the housing 110 may include a display 112 and an actuation member or button 114 disposed within or adjacent to a channel or other such receiving module. The channel of the housing 110 may include a recess that receives the catch member 106 of the locking assembly. Although not specifically shown, the recess may have a shape that conforms to the catch member 106. In some implementations, the recess may be ramped on one or both lateral sides to enable the catch member 106 to slide on the ramp which causes a retraction of the catch member 106.

Figure 2D:
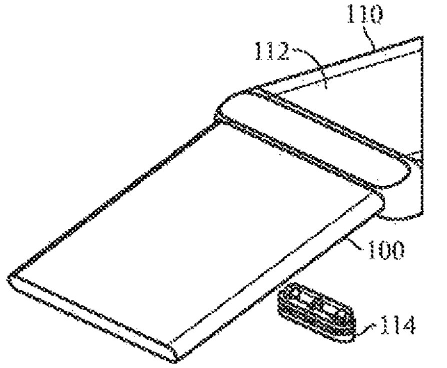
FIG. 2D illustrates a perspective view of the attachment unit and housing combination according to one or more embodiments of the present disclosure.

The housing 110 may also include a button 114 that interacts with the catch member 106 of the locking assembly. In some embodiments, the button 114 may protrude from the housing 110 such as shown in FIG. 2C. Further, the button 114 may have a surface that matches or otherwise conforms to the at least a portion of the catch member 106 such as shown in the perspective view of FIG. 2D. For example a bottom surface of the button 114 may be triangular or otherwise have a shape that matches or corresponds to the shape of a protrusion on the catch member 106.

As described above, the button 114 may be used to expel the catch member 106 from the recess. For example, in response to actuation of the button 114 on the housing 110, the button 114 contacts the catch member 106 of the locking assembly. Continued movement of the button 114 causes the spring 108 within the locking assembly to contract which enables the catch member 106 to be retracted into the attachment unit 100. Once the catch member 106 has been retracted, the attachment unit 100 may be removed from the channel of the housing 110.

Figure 2E:
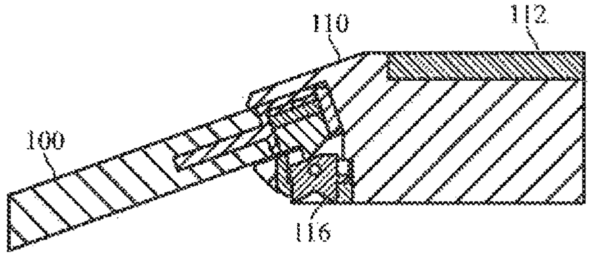
FIG. 2E illustrates a cross-section view of the attachment unit of FIG. 2A being inserted into a housing of a consumer product according to one or more alternate embodiments of the present disclosure.
Figure 2F:
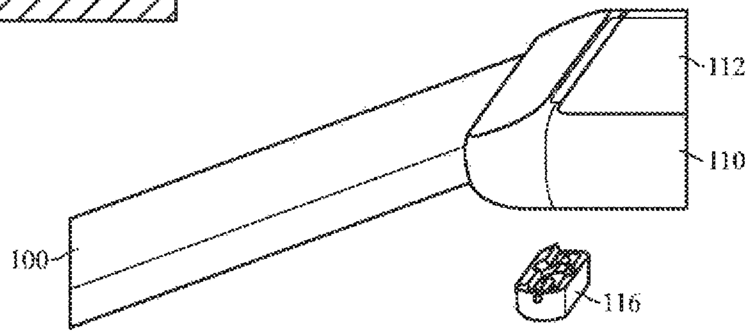
FIG. 2F illustrates a side view of the attachment unit and housing combination according to an alternate embodiment one or more embodiments of the present disclosure.

FIG. 2E-FIG. 2F illustrate an alternate embodiment of the button 116 that may be used with embodiments of the present disclosure. The button 116 of this embodiment may function in a similar manner to the button 114 described above. However, the button 116 on the housing 110 has a different configuration. For example, the button 116 may have a smaller profile such as, for example, a ball-point pen assembly. As such, the button 116 may be recessed within the housing 110 such as shown in FIG. 2E. In this example, the button 116 may be actuated by a finger of a user or may be actuated by a tool or other such mechanism.

Figure 3A:
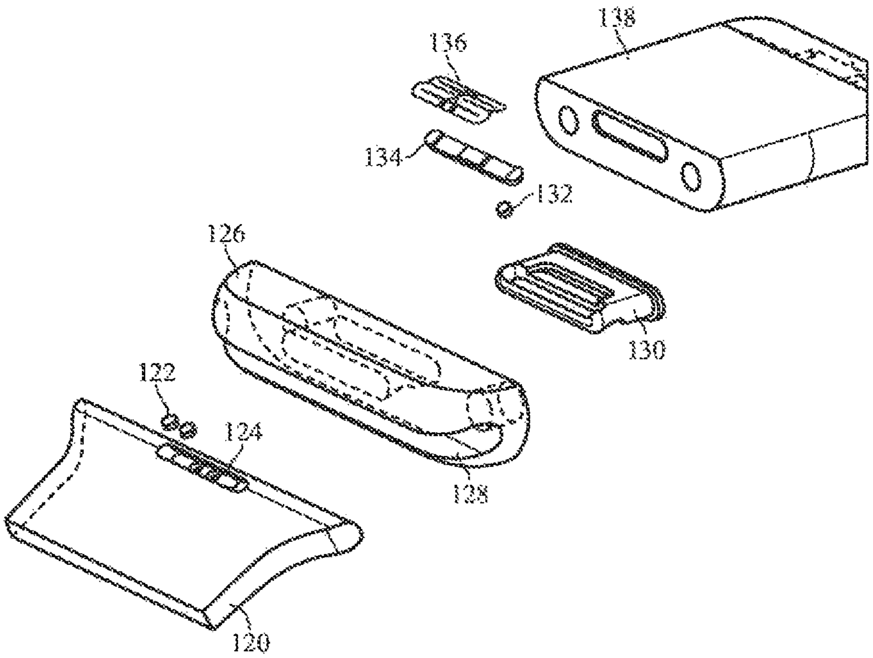
FIG. 3A illustrates an exploded view of attachment unit and corresponding receiving unit having a magnetic locking assembly according to one or more embodiments of the present disclosure.
Figure 3B:
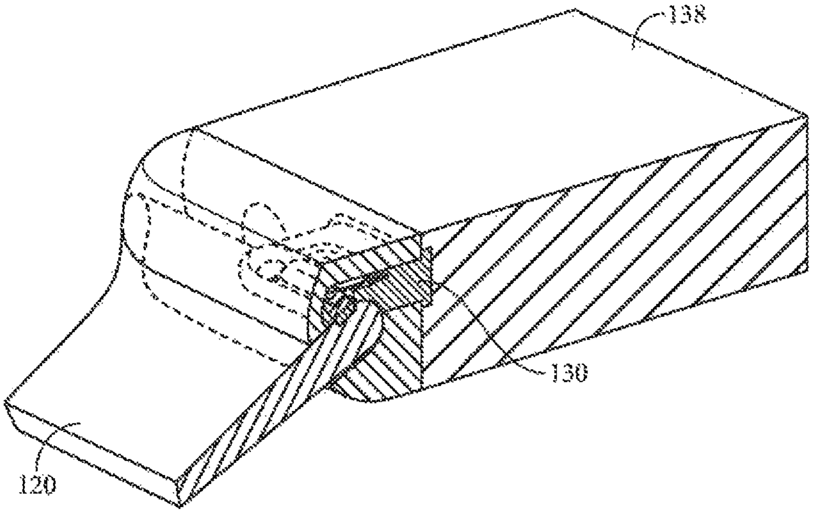
FIG. 3B illustrates a cross-section view of the attachment unit and housing combination of FIG. 3A according to one or more embodiments of the present disclosure.

FIG. 3A illustrates an exploded view of attachment unit 120 having a receiving feature for a locking assembly contained within a housing 138 according to one or more embodiments of the present disclosure. In this embodiment, the locking assembly of the housing 138 may include a spring 136 that is coupled to a catch member 134 and a magnet 132. The spring 136, the catch member 134 and the magnet 132 are contained within a recess 130 that may be disposed within a receiving unit 126 such as shown in FIG. 3B. As will be explained below, the receiving unit 126 is configured to receive and secure the attachment unit 120 using the above described magnetic locking assembly. The attachment unit 120 may include a recess 124 configured to hold one or more magnets 122. In addition, the recess 124 is configured to receive the catch member 134 of the locking assembly.

The magnets in the locking assembly may be configured to hold the catch member 134 in the recess 130 within the channel 128 such that the attachment unit 120 may be inserted into the channel 128. Once the attachment unit 120 has been inserted into the channel 128 (e.g., by lateral or straight insertion), the magnets 122 in the attachment unit 120 attract the catch member 134 of the locking mechanism. This attraction causes the catch member 134 (via the spring mechanism 136) to move toward the recess 124 in the attachment unit 120 thereby securing the attachment unit 120 within the channel 128 such as shown in FIG. 3B.

To remove the attachment unit 120 from the channel 128, lateral force (or force in another direction) may be applied to the attachment unit 120. In response to the applied force, the magnetic pull of the magnets 122 may be overcome and the magnet 132 in the locking assembly causes the catch member 134 to retract back into the recess 130 within the channel 128. As a result, the attachment unit may have unobstructed movement within the channel 128.

Figure 4A:
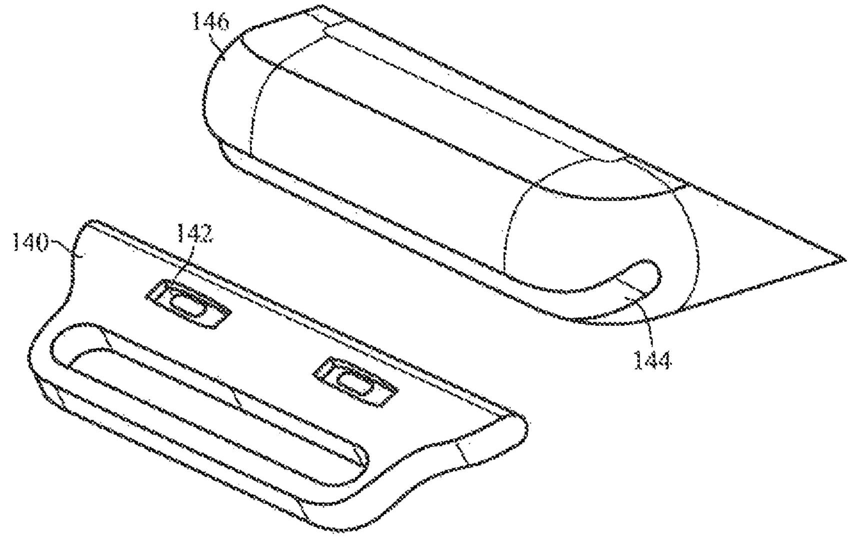
FIG. 4A illustrates an attachment unit having a magnetic locking assembly and corresponding receiving unit of a housing according to one or more alternative embodiments of the present disclosure.
Figure 4B:
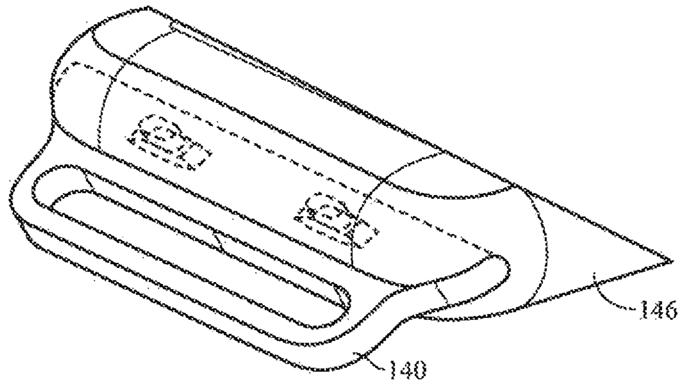
FIG. 4B illustrates the attachment unit of FIG. 4A being inserted into the receiving unit of the housing according to one or more embodiments of the present disclosure.

FIG. 4A illustrates an attachment unit 140 having magnetic teeth 142 that are configured to be received into one or more recesses within a channel 144 of a housing 146 according to one or more alternative embodiments of the present disclosure. In this embodiment, the attachment unit 140 is configured to laterally slide within the channel 144 of the housing 146. Once the attachment unit 140 has been inserted within the channel 144 such as shown in FIG. 4B, the magnetic teeth 142 within the attachment unit 140 are magnetically coupled to corresponding magnets 148 within a recess of the channel 144.

More specifically, the magnetic teeth 142 of the attachment unit 140 are configured to move between a retracted position and an extended position. In the retracted position, the magnetic teeth 142 are contained within a body of the attachment unit 140 using one or more magnets disposed underneath the teeth 142.

Figure 4C:
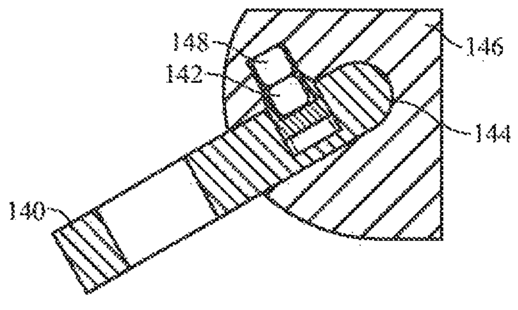
FIG. 4C illustrates a cross-section view of the attachment unit and the receiving unit of FIG. 4B according to one or more embodiments of the present disclosure.

For example, the magnetic teeth 142 of the attachment unit 140 may be flush or sub-flush with respect to a top surface of the attachment unit 140 using one or more magnets contained within the body of the attachment unit 140. When the attachment unit 140 is placed within the channel 144 of the housing 146, one or more magnets 148 (FIG. 4C) within a recess within the channel 144 of the housing 146 pull the magnetic teeth 142 of the attachment unit 140 into corresponding recesses thereby locking the attachment unit 140 in place within the channel 144.

In some embodiments, the magnetic teeth 142 and/or the recess within the channel 144 may have a ramped configuration. This configuration enables the magnetic teeth 142 to overcome the magnetic coupling between the magnetic teeth 142 and magnets 148 when a force is applied to the attachment unit 140. As a result of the applied force, the magnetic teeth 142 may be pulled back into the attachment unit 140 (e.g., reenter the retracted state) thereby enabling the attachment unit 140 to be removed from the channel 144 of the housing 146.

Figure 5A:
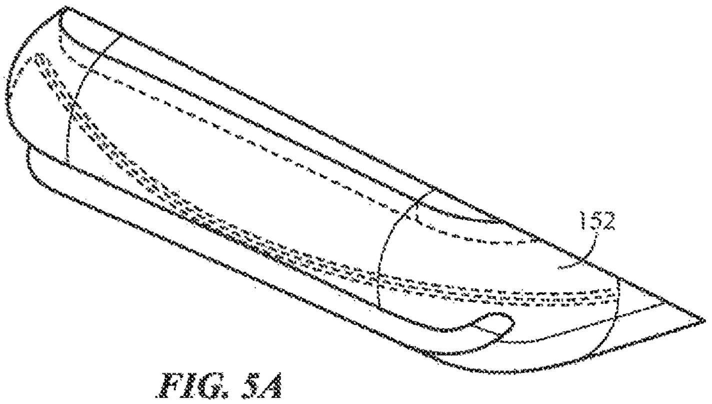
FIG. 5A illustrates a housing of a consumer product according to one or more embodiments of the present disclosure.
Figure 5B:
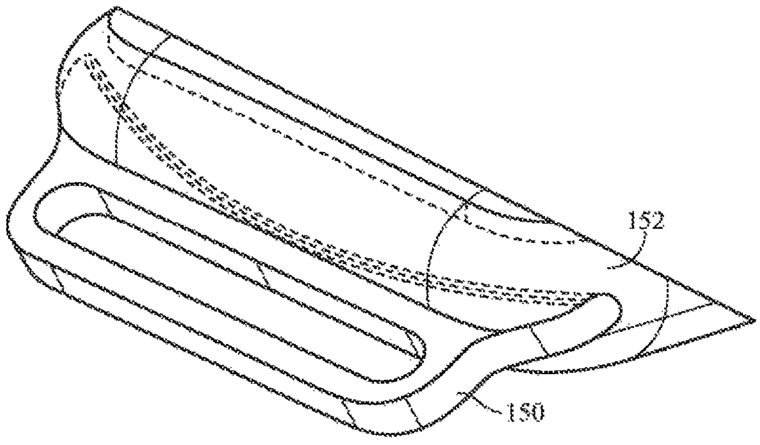
FIG. 5B-FIG. 5C illustrate various views of an attachment unit being inserted into the housing of FIG. 5A according to one or more embodiments of the present disclosure.
Figure 5C:
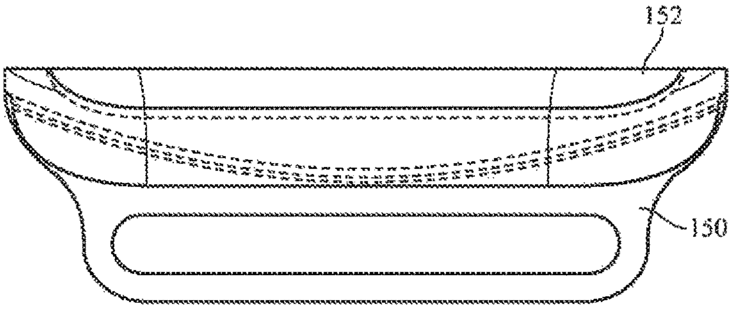

FIG. 5A-FIG. 5C illustrate an alternative arrangement of a housing 152 and an attachment unit 150 according to one or more embodiments of the present disclosure. As shown in these figures, the channel of the housing 152 may be arced or have a rounded or curved configuration. In another embodiment, the housing 152 itself may have a curved or rounded configuration and as such, the channel may also have a rounded or curved configuration. In such embodiments, an attachment unit 150 or a band or accessory that is configured for insertion into the channel of the housing 152 may have a matching configuration.

For example, as shown in FIG. 5B and FIG. 5C, the attachment unit 150 have an arced or rounded configuration that matches the arced or rounded configuration of the channel. Although the attachment unit 150 and the housing 152 have a rounded configuration, the proximal and distal ends of the attachment unit 150 may be flush with respect to one or more sidewalls of the housing 152.

Although not shown, the housing 152 and/or the attachment unit 150 may have one or more locking mechanisms that are configured to secure the attachment unit within the channel. For example, the attachment unit 150 may include a spring-biased ramp and catch member locking assembly that is configured to expand and contract based on movement within the channel.

More specifically, a ramp of the locking assembly may be spring biased proud with respect to a surface of the attachment unit 150 and the catch member may be spring biased flush or substantially flush with respect to a top surface of the attachment unit 150. As the attachment unit 150 is inserted into the channel of the housing 152, the channel causes the ramp portion to retract. The locking assembly remains in this state until the catch member portion of the locking assembly is beneath or proximate to a recess in the channel. The recess enables the spring mechanism within the locking assembly to expand. As a result, the catch member is received into the recess thereby locking the attachment unit 150 within the housing 152.

To release the attachment unit 150 from the channel, a button assembly on the housing may be actuated. Actuation of the button assembly pushes the catch member out of the recess and back into the attachment unit 150. The attachment unit may then be removed from the channel.

Although a specific example has been given, the rounded housing and channel configuration shown in these figures may be used with the various locking mechanisms and attachment units described herein. It is also contemplated that multiple button assemblies and locking assemblies may be used including various combinations of locking assemblies, attachment units and housing shapes and orientations.

FIG. 6A-FIG. 6D illustrate an attachment system having a housing 166, and an attachment unit 160 according to one or more embodiments of the present disclosure. As with the other attachment systems described herein, the attachment unit 160 is configured for lateral insertion into a channel of the housing 166. However, in the embodiments shown in FIG. 6A-FIG. 6D, the housing 166 includes an alignment mechanism 164. The alignment mechanism 164 is configured to be inserted or is otherwise integrated with the channel of the housing 166. The alignment mechanism 164 also includes a rib or other such railed mechanism that aligns with corresponding grooves in the attachment unit 160. As such, the attachment unit 160 may be held within the channel by the rib or the rails.

Figure 6A:
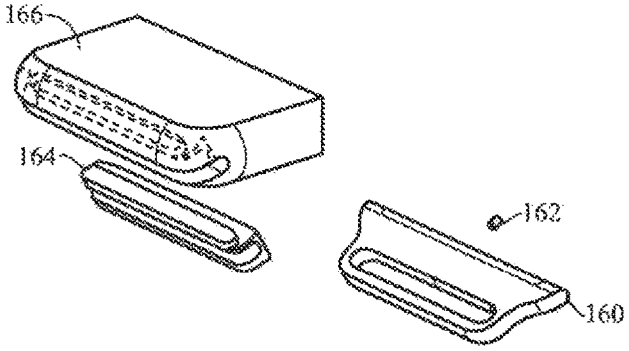
FIG. 6A illustrates an exploded view of an attachment system having a ribbed configuration according to one or more embodiments of the present disclosure.
Figure 6B:
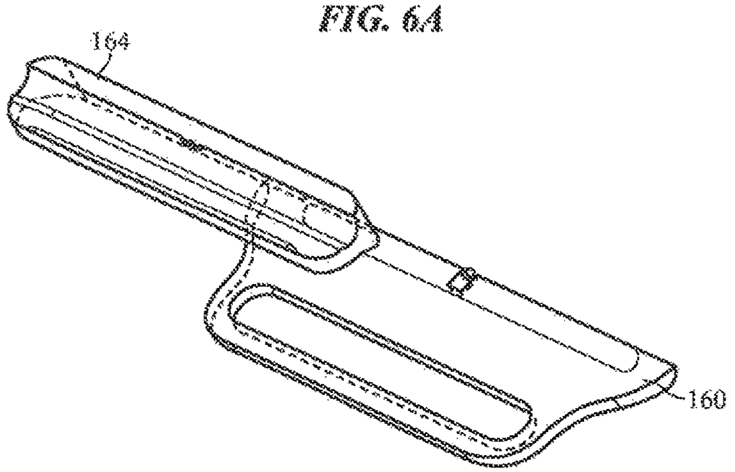
FIG. 6B illustrates an attachment unit and a corresponding ribbed receiving mechanism of FIG. 6A according to one or more embodiments of the present disclosure.
Figure 6C:
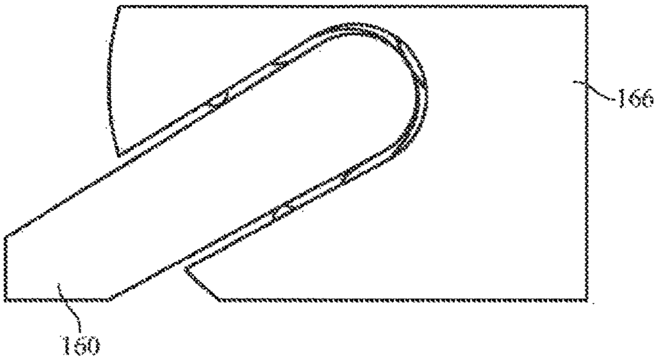
FIG. 6C illustrates a side view of the assembled attachment system of FIG. 6A according to one or more embodiments of the present disclosure.

For example, as shown in FIG. 6B and FIG. 6C, as the attachment unit 160 is inserted into the channel, or more specifically, inserted into the alignment mechanism 164, the ribs within the alignment mechanism 164 are inserted into corresponding grooves disposed on one or more surfaces of the attachment unit 160. The coupling of the ribs and the grooves helps secure the attachment unit 160 within the channel of the housing 166. More specifically, the ribs and the grooves may prevent the attachment unit 160 from being pulled out of the front face of the channel of the housing 166.

In some embodiments, the ribs and corresponding grooves run the entire length of the channel and the attachment unit 160. In other embodiments, the ribs and corresponding grooves partially extend along the channel and the attachment unit 160. Further, in some embodiments, the ribs may be disposed on the attachment unit 160 and the grooves may be disposed on the alignment mechanism 164.

Figure 6D:
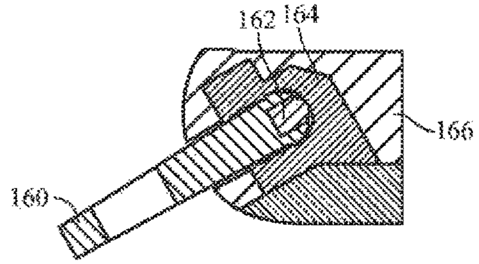
FIG. 6D illustrates a cross-section view of the assembled attachment system of FIG. 6A according to one or more embodiments of the present disclosure.

As also shown in FIG. 6A, the attachment unit 160 may also include ball detent feature 162 that may be used to center and secure the attachment unit 160 within the channel. More specifically, as shown in FIG. 6D, the ball detent feature 162 may be disposed within the attachment unit 160 and be configured to interact with a receiving detent in the channel (or the alignment mechanism 164) of the housing 166. The ball detent feature 162 may include a spring mechanism that enables the ball detent feature 162 to move between a contracted position and an extended position. Thus, when the attachment unit 160 is placed within the channel, the ball detent feature 162 may move into the contracted position which enables the attachment unit to slide within the alignment mechanism 164.

When the ball detent feature 162 is in proximity to a receiving recess disposed within the channel, the ball detent feature may move from the contracted position to the extended position and be received into the recess. Because the ball detent feature 162 includes a spring mechanism, when force is applied to either the proximal end or the distal end of the attachment unit 160, contact with the channel causes the ball detent feature 162 to move from extended position to the contracted position and the attachment unit 160 is able to slide within the channel and be removed from the housing 166.

Figure 7A:
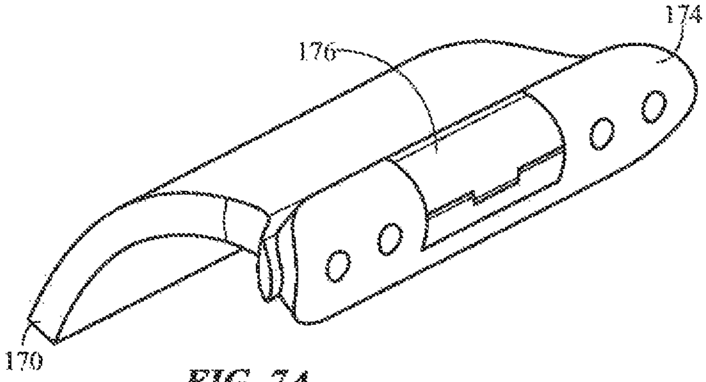
FIG. 7A-FIG. 7B illustrate an exemplary locking mechanism that may be used with one more embodiments of the present disclosure.
Figure 7B:
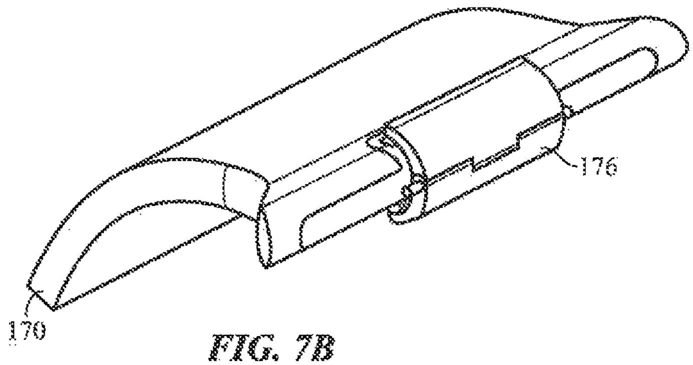
Figure 7C:
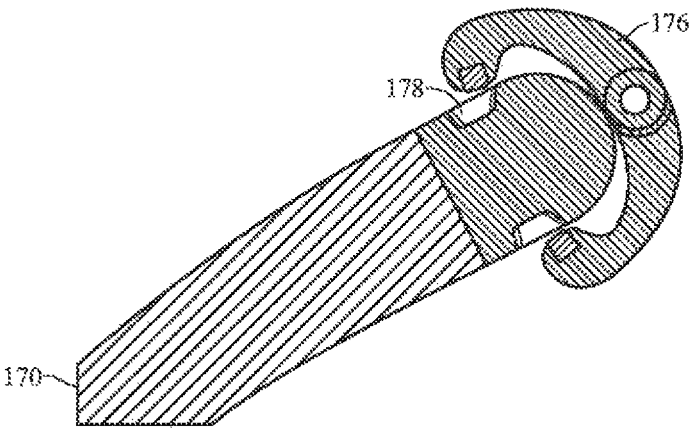
FIG. 7C illustrates a cross-section view of the locking mechanism of FIG. 7A and FIG. 7B according to one or more embodiments of the present disclosure.

FIG. 7A-FIG. 7C illustrate an attachment system according to another embodiment of the present disclosure. In the embodiments shown in these figures, the attachment system may include a band 170 that has one or more receiving features 178 (FIG. 7C) that are configured to be secured to a magnetic clamping mechanism 176. In some embodiments, the receiving features 178 may be disposed on multiple surfaces of the band 170. Thus, when the clamping mechanism 176 moves or pivots on an axis from an open state (such as shown in FIG. 7C) to a closed state in which teeth of the clamping mechanism 176 are received into the receiving features 178, the band 170 may be secured or retained within the housing 172.

For example, the band 170 may be configured for lateral insertion within the channel 174 of the housing 172. Once the band 170 is within the channel 174 and the receiving features 178 are in proximity to the teeth of the clamping mechanism 176, a magnetic force causes the clamping mechanism 176 moves on a common pivot axis and the teeth are received into the receiving features 178.

In some embodiments, the magnetic force may be caused by magnets disposed on the teeth of clamping mechanism 176. In other embodiments, the magnets may be disposed in the receiving features 178. In still yet other embodiments, magnets may be present on both the clamping mechanism 176 and the receiving features 178.

In order to release the band 170 from the channel 174, the teeth of the clamping mechanism 176 and/or the receiving features 178 may have a slanted or a ramped configuration. Thus, as a force is applied to one or more ends of the band 170, the ramped configuration overcomes the magnetic force and the teeth are removed from the receiving features 178.

Figure 8:
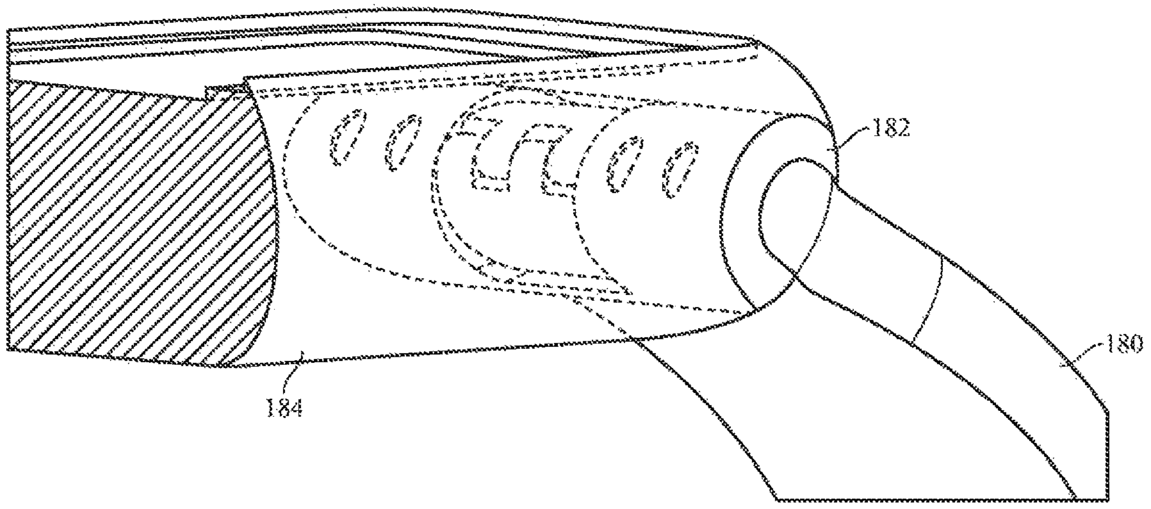
FIG. 8 illustrates an alternate embodiment of the locking mechanism of FIG. 7A according to one or more embodiments of the present disclosure.

In some embodiments, the channel 174 and the clamping mechanism 176 may be integrated directly into a housing of a consumer product. In other embodiments, such as shown in FIG. 8, the clamping mechanism 182 may be a subassembly that is coupled to the housing 184 of a consumer product after production. Thus, as shown in FIG. 8, the band 180 may be inserted into and secured within the housing 184 in a similar manner described above with respect to the FIG. 7A-FIG. 7C.

Figure 9A:
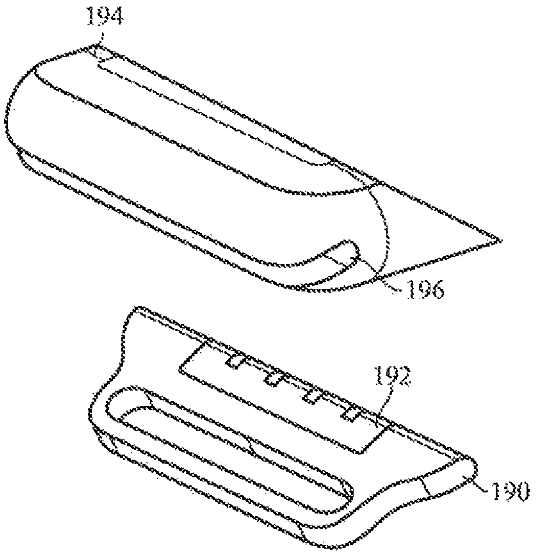
FIG. 9A-FIG. 9C illustrate an attachment system having a pivoting catch member according to one or more embodiments of the present disclosure.
Figure 9B:
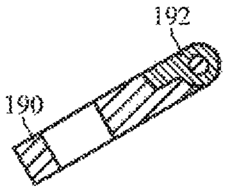
Figure 9C:
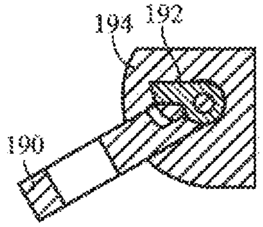

FIG. 9A-FIG. 9C illustrate an attachment system having a pivoting tooth according to embodiments of the present disclosure. In this embodiment, the attachment system includes an attachment unit 190 that is configured to laterally slide within a channel 196 of a housing 194. The attachment unit 190 includes a magnetic catch member 192 that is configured to pivot from a first position in which the catch member 192 is flush with respect to a surface of the attachment unit 190 (such as shown in FIG. 9B), to a second position in which the catch member is received into a recess within the channel 196 (such as shown in FIG. 9C). That is, a magnetic pull from a magnet within the recess in the channel 196 causes the catch member 192 to pivot away from the attachment unit 190 and into a recess within the channel 196. This pivoting motion locks the attachment unit 190 within the channel 196.

To release the catch member 192, a button (not shown) on the housing 194 may be actuated which releases the catch member from the recess. In other embodiments, the catch member 192 and/or the recess within the channel 196 may have a ramped configuration that enables the catch member 192 to move from the second position to the first position in response to an applied force.

Figure 10A:
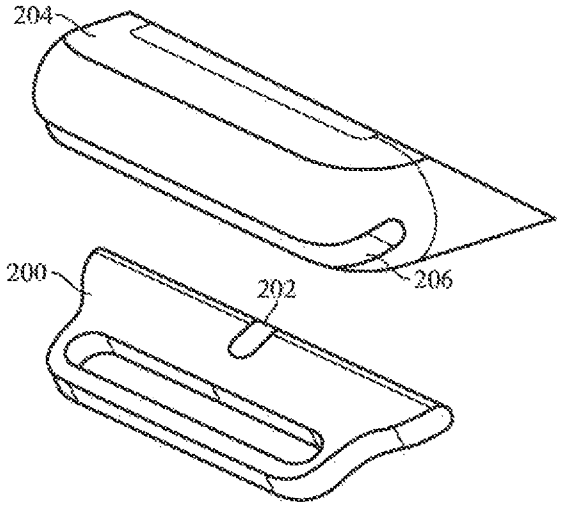
FIG. 10A-FIG. 10C illustrate an attachment system having a pivoting catch member according to one or more alternate embodiments of the present disclosure.
Figure 10B:
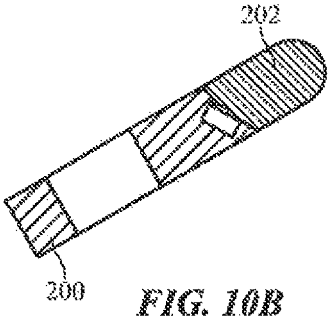
Figure 10C:
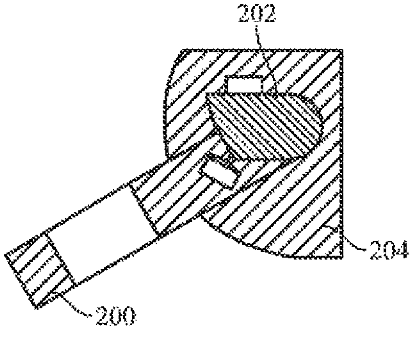

FIG. 10A-FIG. 10C illustrate an attachment system having a pivoting catch member according to an alternate embodiment of the present disclosure. The embodiments shown in FIG. 10A-FIG. 10C are similar to the embodiments shown above with respect to FIG. 9A-FIG. 9C. For example and as shown, the attachment system includes an attachment unit 200 that is configured to laterally slide within a channel 206 of a housing 204. The attachment unit 200 includes a magnetic catch member 202 that is configured to pivot from a first position in which the catch member 202 is flush with respect to a surface of the attachment unit 200 (such as shown in FIG. 10B), to a second position in which the catch member is received into a recess within the channel 206 (such as shown in FIG. 10C). That is, a magnetic force applied by a magnet within the recess in the channel 206 causes the catch member 202 to pivot away from the attachment unit 200 and into a recess within the channel 206. This pivoting motion locks the attachment unit within the channel 206.

To release the catch member 202 from the recess, a button (not shown) on the housing 204 may be actuated. In other embodiments, the catch member 202 and/or the recess within the channel 206 may have a ramped configuration that enables the catch member 202 to move from the second position to the first position in response to an applied force. Once the catch member 202 has been released from the recess, the attachment unit 200 may be removed from the channel 206.

Figure 11A:
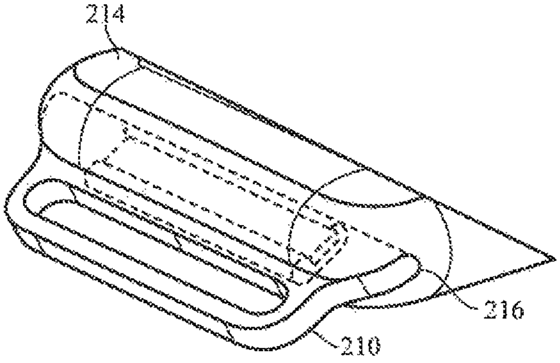
FIG. 11A-FIG. 11C illustrate an attachment system having a pivoting catch member according to one or more additional embodiments of the present disclosure.
Figure 11B:
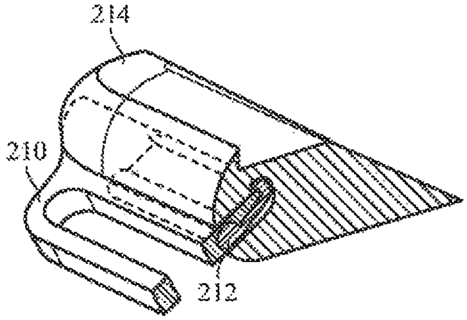
Figure 11C:
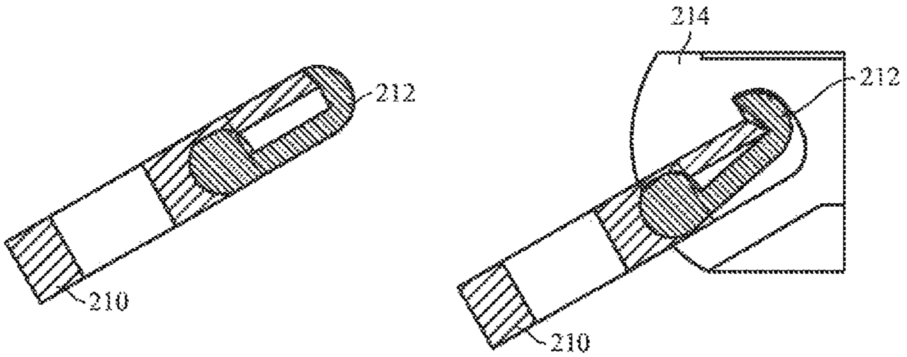

FIG. 11A-FIG. 11C illustrate another exemplary attachment system having a pivoting catch member according to alternative embodiments of the present disclosure. The embodiments shown in FIG. 11A-FIG. 11C are similar to the embodiments shown above with respect to FIG. 9A-FIG. 10C. However, unlike the catch member that pivots away from the attachment unit in the above embodiments, the attachment system of FIG. 11A-FIG. 11C includes an attachment unit 210 having a catch member 212 that pivots into the attachment unit 210 and is secured into a recess within channel 216 of a housing 214.

For example and as shown in the figures, the attachment unit 210 is configured to laterally slide within a channel 216 of a housing 214. The attachment unit 210 includes a magnetic catch member 212 that is configured to pivot from a first position in which the catch member 212 is flush with respect to a surface of the attachment unit 200 (such as shown in FIG. 11C), toward the attachment unit 210 to a second position in which a portion of the catch member 212 extends beyond an opposite surface of the attachment unit 210 and is received into a recess within the channel 216 (such as shown in FIG. 11B). For example, a hook portion of the catch member 212 may be received into the recess.

That is, a magnetic pull of a magnet within the recess in the channel 216 causes the catch member 212 to pivot into the attachment unit 210 and into a recess within the channel 216. This pivoting motion locks the attachment unit 210 within the channel 216.

To release the catch member 212, a button (not shown) on the housing 214 may be actuated which releases the catch member 212 from the recess. In other embodiments, the catch member 212 and/or the recess within the channel 216 may have a ramped configuration that enables the catch member 212 to move from the second position to the first position in response to an applied force. Once the catch member 212 has been released from the recess, the attachment unit 210 may be removed from the channel 216.

Figure 12A:
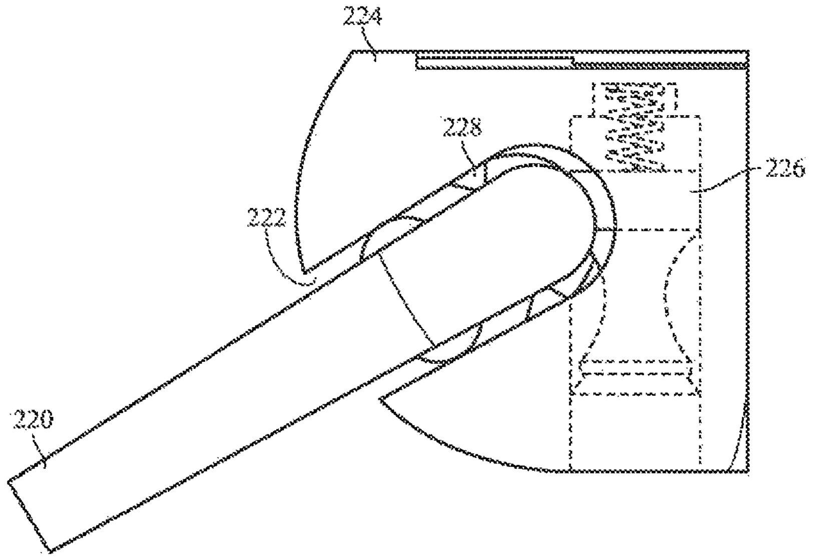
FIG. 12A-FIG. 12B illustrate an attachment system having an hourglass locking assembly according to one or more embodiments of the present disclosure.
Figure 12B:
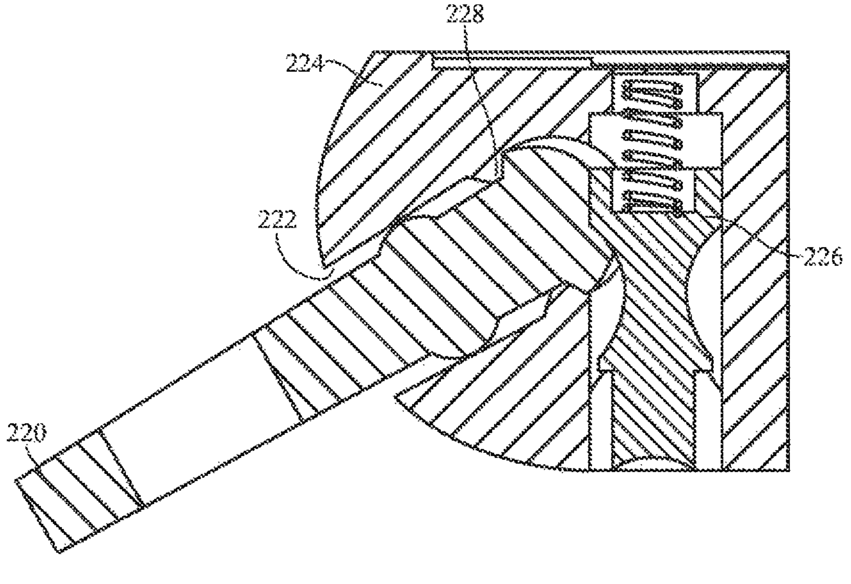

FIG. 12A-FIG. 12B illustrate an attachment system according to another alternate embodiment of the present disclosure. The attachment system shown in FIG. 12A and FIG. 12B includes an attachment unit 220 configured to laterally slide within a channel 222 of a housing 224. In some embodiments, the channel 222 may include one or more ribs 228. The ribs 228 may be similar to the alignment mechanism described above with respect to FIG. 6A-FIG. 6D. Accordingly, the attachment unit 220 may also have grooves or other depressions that mate with the ribs 228 in order to secure the attachment unit 220 within the channel 222. In other embodiments, the attachment unit 220 may have one or more protrusions or ribs that mate with corresponding grooves within the channel 222.

The attachment system may also include an hourglass locking mechanism 226. The hourglass locking mechanism 226 may be configured to move from a first position, that enables the attachment unit 220 to slide within channel 222, to a second position in which the hourglass locking mechanism 226 engages a recess disposed on the front (or rounded transition) of the attachment unit 220. More specifically, when the attachment unit 220 reaches a certain point within the channel 222, the hourglass locking mechanism 226 engages the recess on attachment unit 220 to lock the attachment unit in place within the channel 222.

In some embodiments, the hourglass locking mechanism 226 may be actuated by a button or other actuation mechanism such as described above. In other embodiments, the hourglass locking mechanism 226 and/or the recess disposed on the attachment unit 220 may have a ramped configuration such as described with other embodiments described herein.

Figure 13A:
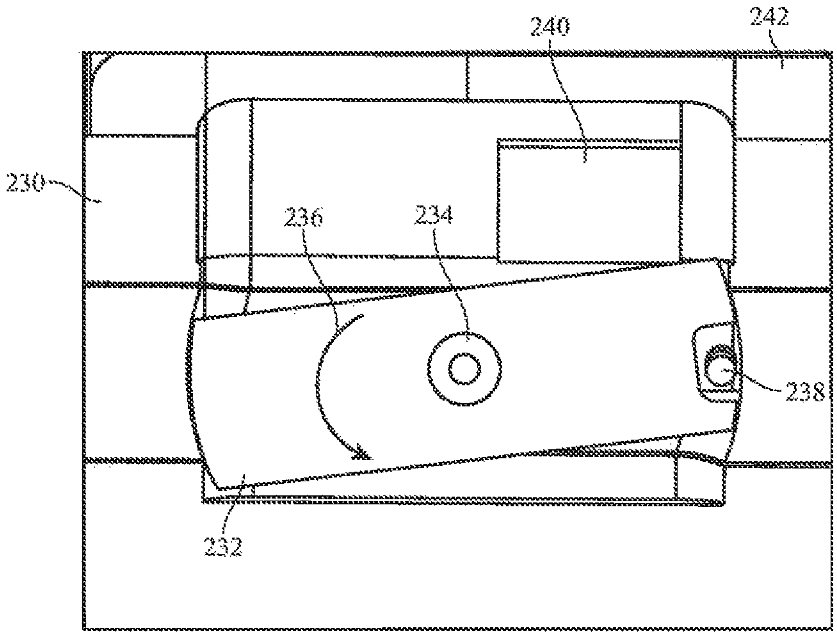
FIG. 13A-FIG. 13B illustrate an attachment system having a magnetic locking assembly according to one or more embodiments of the present disclosure.
Figure 13B:
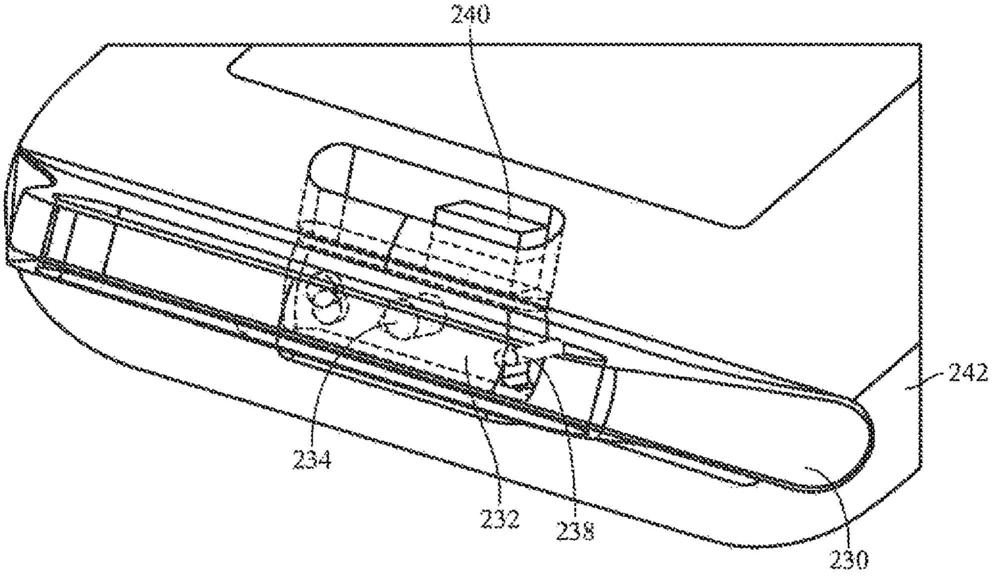

FIG. 13A-FIG. 13B illustrate a magnetic locking assembly for an attachment system according to embodiments of the present disclosure. In the embodiment shown in these figures the attachment system includes an attachment unit 230 configured to laterally slide within a channel of a housing 242.

The attachment unit 230 may include a rotating magnetic latch 232 disposed in a body of the attachment unit 230. The magnetic latch 232 is configured to rotate about a pivot point 234 in the direction of the arrow 236 in response to a magnetic force. In some embodiments, an amount of rotation of the magnetic latch 232 may be defined by one or more hard stops 238 within the attachment unit 230. In addition, the magnetic latch 232 may be comprised of magnetic stainless steel and/or may also include a magnet.

The housing of the attachment system shown in FIG. 13A and FIG. 13B may also include a moveable magnet 240 (or a magnetic sliding button) disposed within the housing 242. In addition, the channel may contain an upper recess and a lower recess. In some embodiments, the magnet 240 is disposed above an upper recess. Further the moveable magnet 240 may be moved in response to user actuation and in turn, causes the magnetic latch 232 to pivot.

For example, when the attachment unit 230 has been inserted into the channel of the housing 242, the moveable magnet 240 on the housing slides within the recess in response to user actuation. As the magnet 240 slides or otherwise moves from a first position to a second position, a magnetic force caused by the magnet 240 causes the magnetic latch 232 to rotate about the pivot point 234. As the magnetic latch 232 rotates, the magnetic latch 232, or portions of the magnetic latch 232, may extend from a top and/or bottom surfaces of the attachment unit 230 and are received into the upper and/or lower recesses disposed within the channel of the housing 242.

When positioned in this manner (such as shown in FIG. 13A) the magnetic latch 232 secures the attachment unit 230 within the channel of the housing 242. Likewise, movement of the magnet 240 in the opposite direction causes the latch to rotate back into its nominal (e.g., horizontal or original position) thereby unlocking the attachment unit.

Figure 14A:
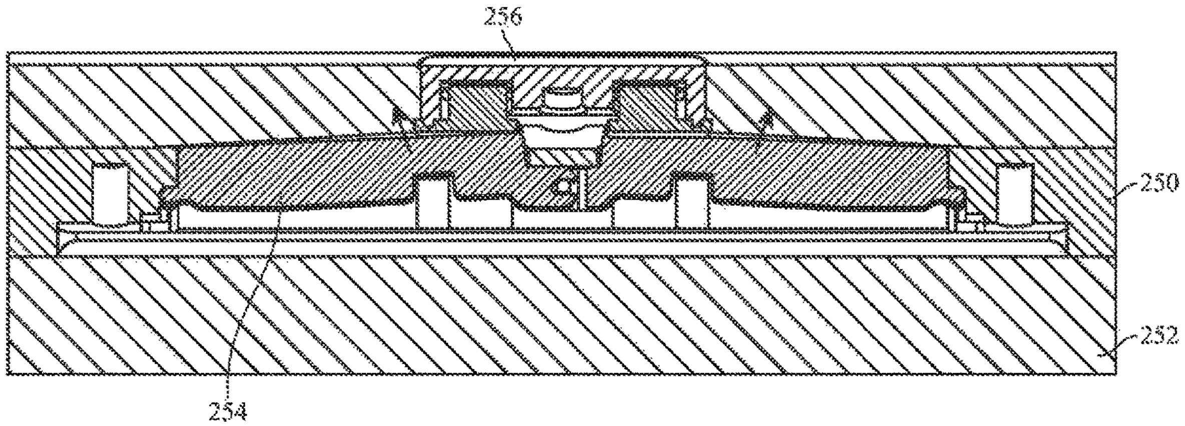
FIG. 14A-FIG. 14B illustrate an attachment unit having a pivoting bar latch according to one or more embodiments of the present disclosure.
Figure 14B:
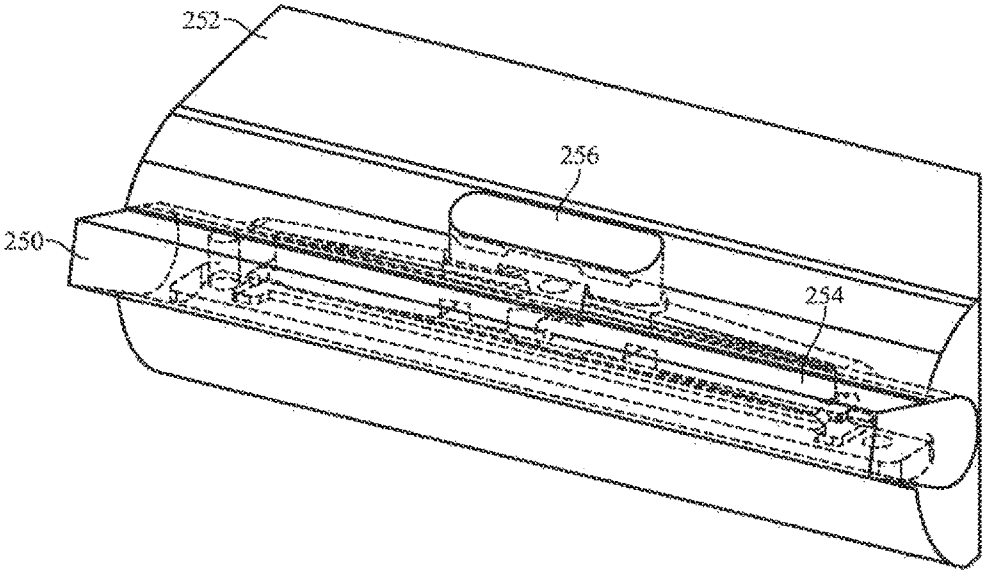

FIG. 14A and FIG. 14B illustrate an attachment system having a bar latch configuration according to embodiments of the present disclosure. In this embodiment, the attachment system includes an attachment unit 250 configured to slide within a channel of a housing 252. In some embodiments, the channel may have a slanted or ramped configuration that opens into a recess within the channel. As shown in FIG. 14A, the recess includes a button 256.

The attachment unit 250 includes a pivoting bar latch 254. The bar latch 254 may be spring biased proud such that one or more protrusions or teeth extend from a surface of the attachment unit 250. More specifically, the bar latch 254 may have a spring biased first portion coupled to a spring biased second portion. Thus, as one portion of the bar latch 254 moves, the other portion of the bar latch 254 moves in the same direction.

As the attachment unit 250 is inserted into a channel of a housing 252, the bar latch 254 moves from the first position in which one or more portions of the bar latch 254 extend from the surface of the attachment unit 250 to a second position in which the one or more teeth are flush or substantially flush with respect to a surface of the attachment unit 250. However, as the attachment unit 250 continues to slide within the channel, the slanted configuration of the channel allows the bar latch 254 to expand outwardly until the one or more teeth of the bar latch 254 are received into the button recess.

As previously discussed, the recess within the channel includes a button 256 that when actuated, expels the bar latch 254 from the recess. In some embodiments, both the first portion of the bar latch 254 and the second portion of the bar latch 254 may be received into different recesses. In another embodiment, the channel may have a protrusion or other feature that is configured to fit within a space between the first portion of the bar latch 254 and the second portion of the bar latch 254. In such embodiments, the button 256 may be configured to interact with or otherwise actuate both the first portion of the bar latch 254 and the second portion of the bar latch 254 simultaneously or substantially simultaneously.

Figure 15:
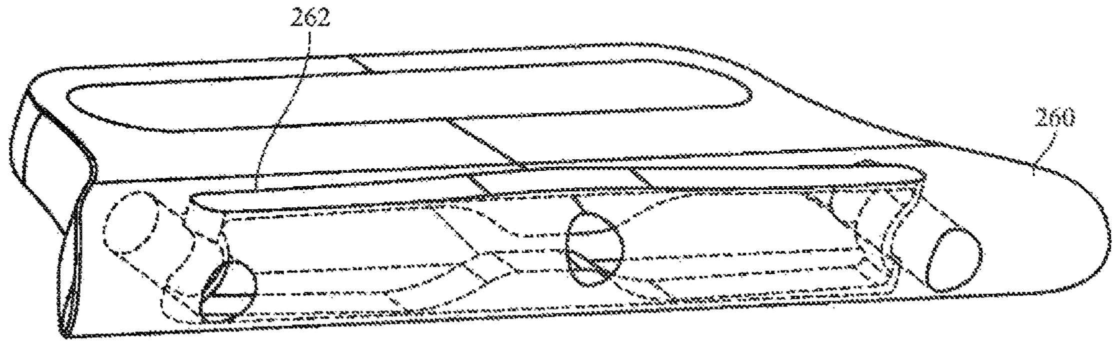
FIG. 15 illustrates an exemplary attachment unit that may be used with one or more embodiments described herein.

FIG. 15 illustrates an attachment unit 260 according to embodiments of the present disclosure. The attachment unit 260 may be used in conjunction with the other housing embodiments described herein. For example, the attachment unit 260 may be used with the hourglass locking assembly described above.

As shown in FIG. 15, the attachment unit 260 includes spring bows 262 disposed on a top surface and on a bottom surface of the attachment system. In a nominal position, each spring bow 262 may be flush on outer ends and proud in the middle. As the attachment unit 260 is inserted into a channel of a housing, the spring bows 262 may contract such that the attachment unit 260 can be smoothly inserted. More specifically, a locking mechanism within the channel may be coupled to one or more recesses disposed underneath the spring bows 262. Thus, as the spring bows 262 contract, the locking assembly within the channel are able to be coupled to the recesses. Such a configuration may help prevent forward pullout of the attachment unit 260.

Figure 16B:
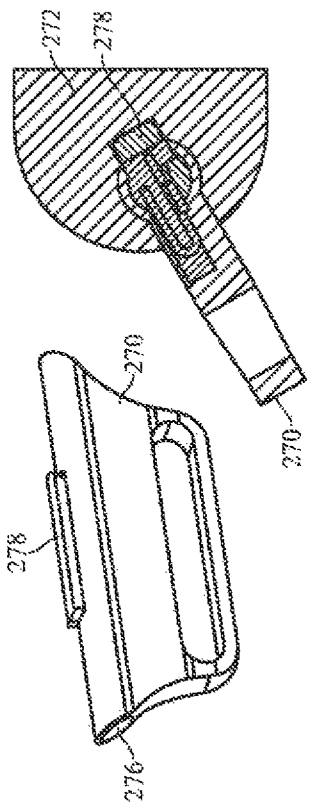
FIG. 16A-FIG. 16C illustrate an exemplary attachment system that includes a pin assembly configured to cause the catch member to move from a retracted position to an extended position according to one or more embodiments of the present disclosure.
Figure 16C:
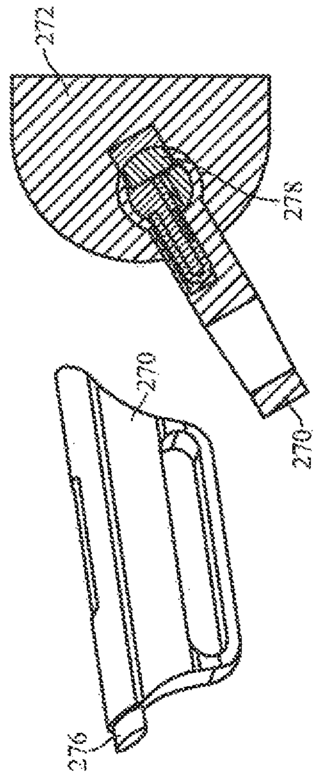
Figure 16A:
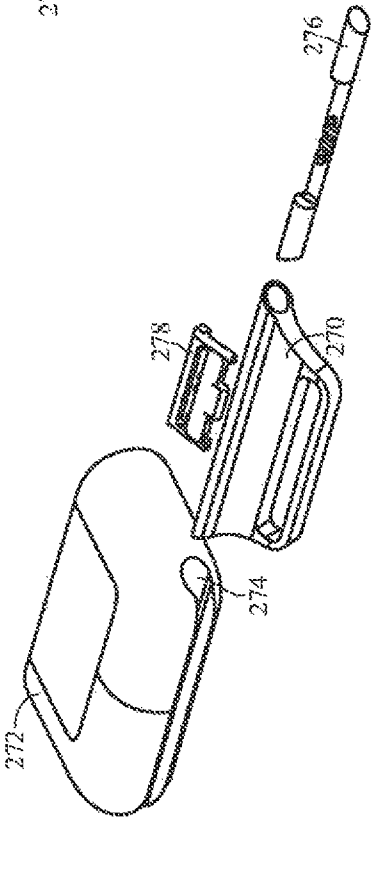

FIG. 16A-FIG. 16C illustrate an attachment system having a pushpin locking assembly according to another embodiment of the present disclosure. More specifically, FIG. 16A illustrates an attachment unit 270 that is configured for lateral insertion and removal from a channel 274 of a housing 272. The attachment unit 270 includes a catch member 278 that is configured to move from a retracted position to an extended position in response to user actuation of the pin mechanism 276. Thus, when the attachment unit 270 is inserted into the channel 274 of the housing 272, the catch member 278 may be inserted into and removed from a recess within the housing.

More specifically and as shown in the figures, the attachment unit 270 includes a retracting catch member 278 that is coupled to a pin mechanism 276. The pin mechanism 276 includes various detents interact with the catch member 278. For example, when the pin mechanism 276 is actuated, the detents on the pin mechanism 276 interact with or engage a spring coupled to the catch member 278. Thus, as the pin mechanism 276 moves laterally within the attachment unit 270, the detents on the pin mechanism 276 may engage with a ramp or various V-shaped channels on the catch member 278 that cause the spring to move the catch member 278 from a retracted position such as shown in FIG. 16C to an extended position such as shown in FIG. 16B.

For example, as shown in FIG. 16B, when the pin 276 is flush or substantially flush with respect to proximal and distal ends of the attachment unit 270, the catch member 278 is extended and when the attachment unit 270 is inserted into the channel 274 of the housing, the catch member 278 is received into the recess. However, when a portion of the pin 276 extends from the attachment unit 270, the catch member is retracted such as shown in FIG. 16C. In some embodiments, the pin may extend from one side of the attachment unit 270 when retracted and another side when extended.

Figure 17A:
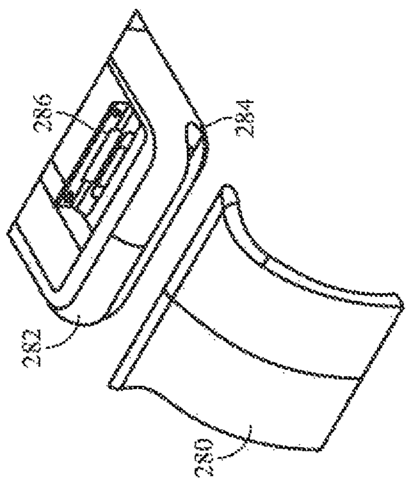
FIG. 17A-FIG. 17C illustrate an attachment system in which the housing of the consumer product includes a locking assembly according to one or more embodiments of the present disclosure.
Figure 17B:
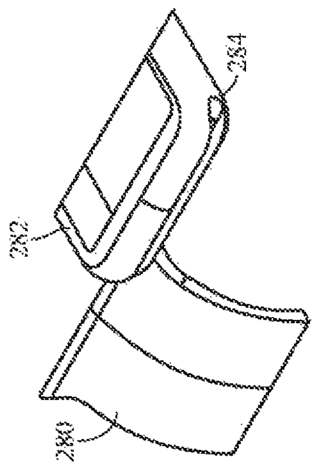
Figure 17C:
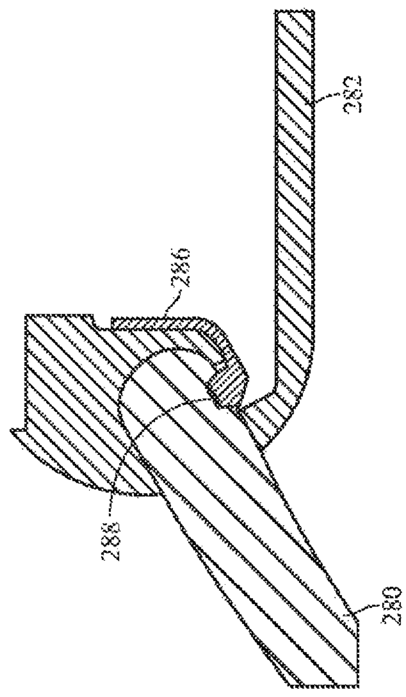

FIG. 17A-FIG. 17C illustrate an attachment system having a key locking assembly disposed in the housing according embodiments of the present disclosure. In this particular embodiment, the attachment system may include a band 280 that is configured for lateral insertion into a channel 284 of a housing 282 such as shown in FIG. 17B. In some embodiments, the channel 284 includes a spring key 286 (FIG. 17C) that is configured to be received into a recess 288 that is disposed on a surface of the inserted portion of the band 280. When the key 286 has been received into the recess 288, the band 280 is locked within the housing 282. In some embodiments, the spring key 286 and/or the recess 288 on the band 280, may have a ramp to assist in disengaging the spring key 286 from the recess 288 (e.g., in response to an applied force).

Figure 18A:
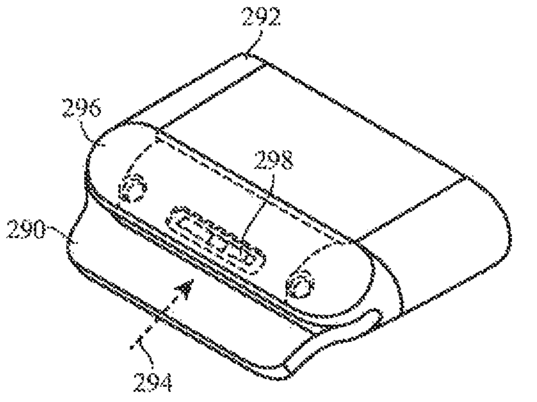
FIG. 18A-FIG. 18C illustrate an attachment system in which the housing of the consumer product includes a locking assembly according to one or more alternative embodiments of the present disclosure.
Figure 18B:
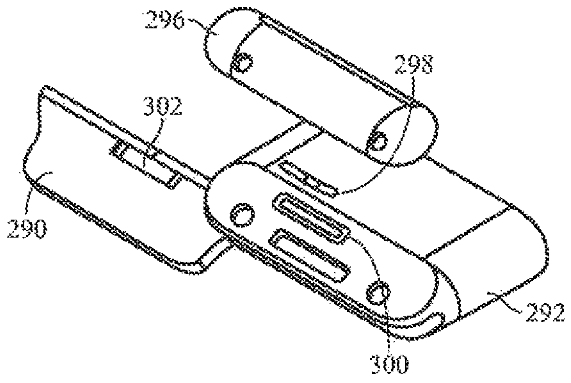
Figure 18C:
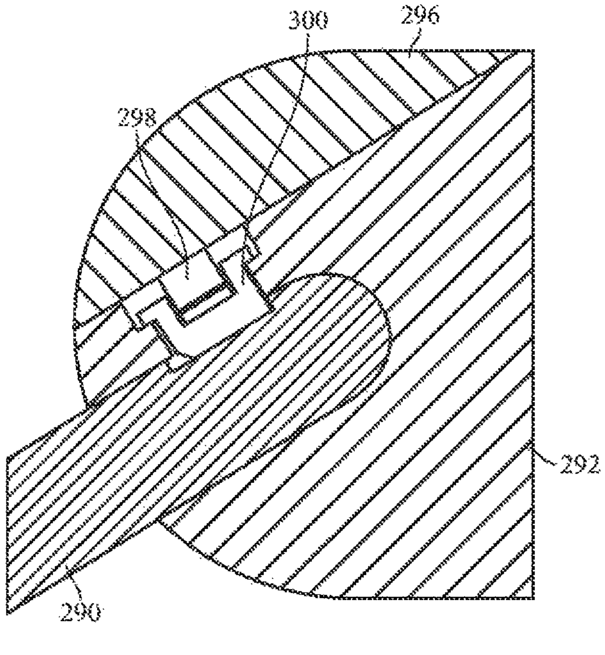

FIG. 18A-FIG. 18C illustrate an attachment system having a spring loaded locking assembly disposed within the housing according to another embodiment of the present disclosure. In these embodiments, the attachment unit 290 may be configured for forward insertion (shown by arrow 294) into a channel of a housing 292 such as shown in FIG. 18A or lateral insertion such as shown in FIG. 18B.

The attachment unit 290 includes a recess 302 that is configured to receive a key 300 disposed within a corresponding recess within a channel of the housing 292. The key 300 may be coupled to a spring mechanism 298. Thus, as the attachment unit 290 is inserted into the channel (either laterally via a sliding motion or forward insertion) the spring mechanism 298 enables the key 300 to retract. Once the attachment unit 290 has been inserted into the channel of the housing 292, the spring mechanism 298 causes the key 300 to be received into the recess 302 on the attachment unit 290 such as shown in FIG. 18C. For purposes of assembling the key 300 and the spring mechanism 298 within the housing 292, a removable cover 296 may be coupled to the housing 292.

In some embodiments, the key 300 and/or the recess 302 in the attachment unit 290 may be have a ramped or slanted configuration. The ramped or slated configuration may assist in the insertion and removal of the attachment unit 290 from the housing 292. For example, as shown in FIG. 18C, a front portion of the key 300 includes a chamfer. The chamfer may assist in the forward insertion of the attachment unit 290 and/or lateral removal of the attachment unit 290.

FIG. 19A-FIG. 19D illustrate a locking mechanism 310 that may be used with various attachment units according to one or more embodiments of the present disclosure. In some embodiments, the locking mechanism 310 includes a catch portion 312 and a base portion 314. The catch portion 312 is separated from the base portion 314 by a rubber insert 316 and is configured to move toward and away from the base portion 314. Although rubber is specifically mentioned, it is contemplated that other materials may be used.

Figure 19A:
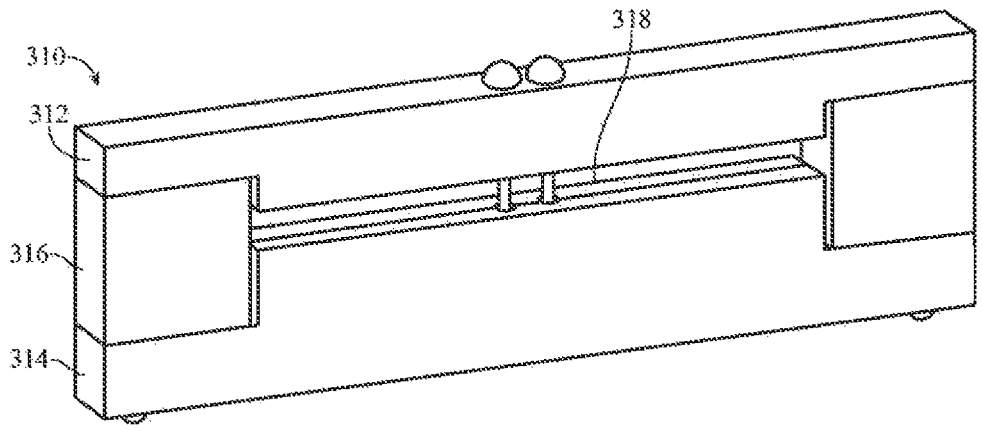
FIG. 19A-FIG. 19B illustrate an attachment unit having a shape memory alloy component according to one or more embodiments of the present disclosure.
Figure 19B:
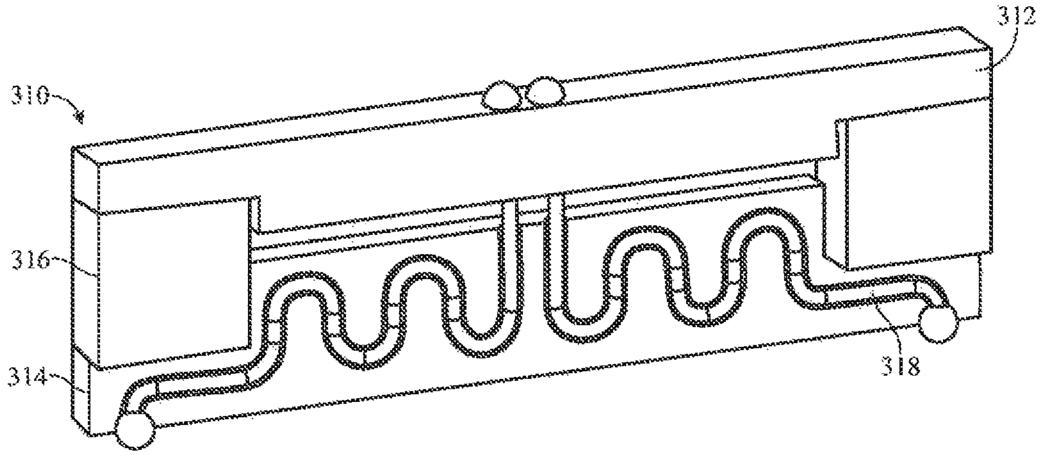

More specifically and as shown in FIG. 19B, the locking mechanism 310 includes a shape memory alloy component 318 that runs through the base portion 314 and into the catch portion 312. The shape memory alloy component 318 causes the catch portion 312 to move between a contracted position and an extended position. For example, when an electric current is applied to the shape memory alloy component 318, the shape memory alloy component 318 contracts. As a result, the catch portion 312 moves in a direction toward the base portion 314 and compresses the rubber inserts 316. When the current is removed, the shape memory alloy component 318 returns to its nominal state or extended state.

Figure 19C:
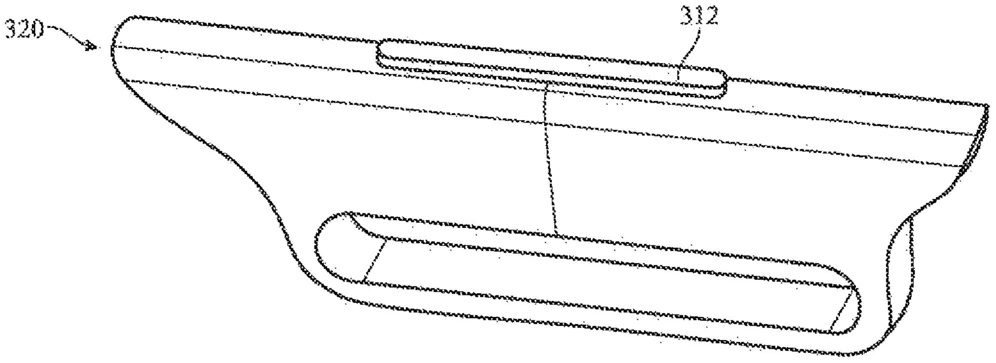
FIG. 19C-FIG. 19D illustrate the attachment unit of FIG. 19A being integrated with an attachment unit and a band according to one or more embodiments of the present disclosure.
Figure 19D:
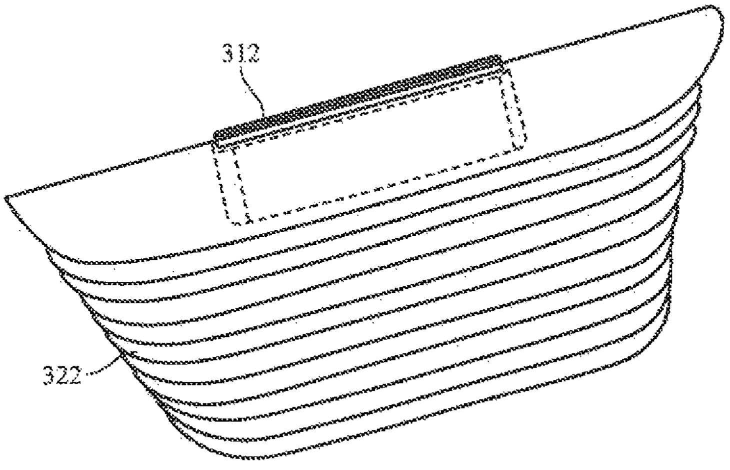

In some embodiments and as shown in FIG. 19C and FIG. 19D, the locking mechanism 310 may be inserted into or otherwise used by various attachment units. For example, as shown in FIG. 19C, the locking mechanism 310 may be part of an attachment unit 320. In the embodiment shown in FIG. 19D, the locking mechanism may be integrated into a band 322. As shown in each of these figures, the catch portion 312 of the locking mechanism 310 may extend from the attachment unit 320 and/or the band 322 when in its nominal state. Further, when a current is applied such as described above, the catch portion 312 may be retracted into the attachment unit 320 or the band 322 to enable the attachment unit 320 or the band 322 to be inserted into channel of a housing.

Once inserted into the channel, the current may be removed from the locking mechanism 310 and the catch portion 312 will again expand and may be received by a recess within the channel of the housing such as described above in other embodiments.

Figure 20A:
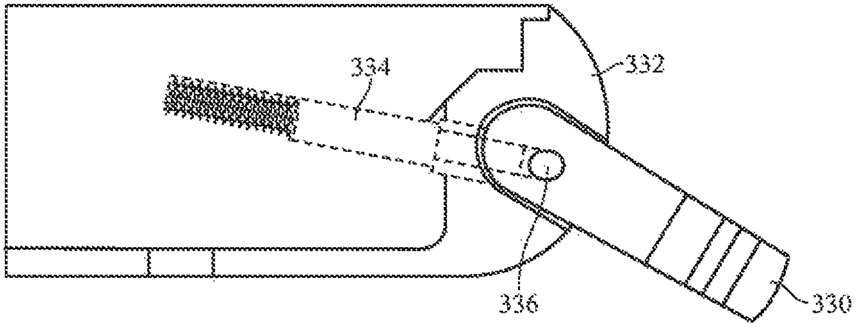
FIG. 20A-FIG. 20B illustrate an attachment system having a pin locking assembly according to one or more embodiments of the present disclosure.
Figure 20B:
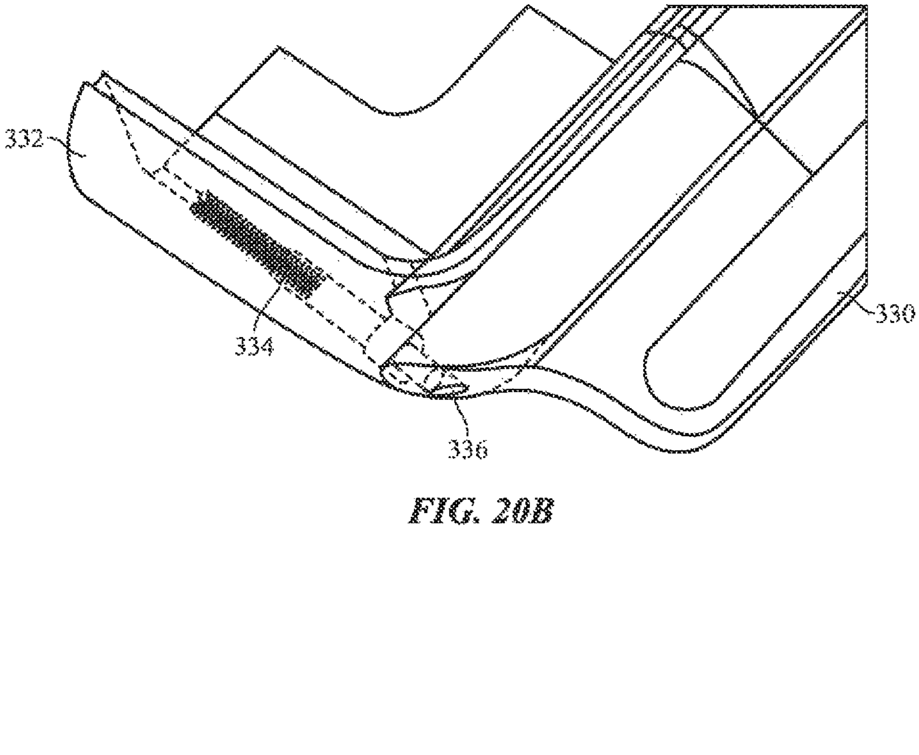

FIG. 20A-FIG. 20B illustrate an attachment system according to another embodiment of the present disclosure. In this embodiment, the attachment system includes an attachment unit 330 configured to laterally slide within a channel of a housing 332. The housing 332 includes a spring loaded pin 334 that is disposed in or otherwise associated with the channel. In addition, the attachment unit 330 includes a receptacle 336 for receiving the pin 334. Therefore, when the attachment unit 330 has been inserted into the channel of the housing 332 and the receptacle 336 is in proximity to the pin 334, the spring mechanism associated with the pin 334 causes the pin 334 to be inserted into the receptacle 336 thereby locking the attachment unit 330 in place within the channel of the housing 332.

To remove the attachment unit 330 from the channel, the pin 334 may need to be compressed. To compress the pin 334, an actuation mechanism (not shown) may be inserted into an open end of the receptacle 336 disposed on the attachment unit 330. When a force is applied to the actuation mechanism, the spring mechanism associated with the pin 334 is compressed and the pin 334 is removed from the receptacle 336. Once the pin 334 has been removed from the receptacle 336, the attachment unit 330 may be removed from the channel of the housing 332.

Figure 21A:
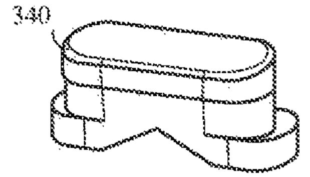
FIG. 21A-FIG. 21C illustrate a button that is configured to be inserted into a band of a consumer product according to one or more embodiments of the present disclosure.
Figure 21B:
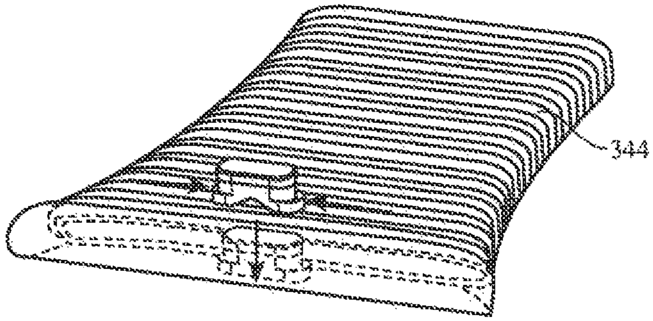
Figure 21C:
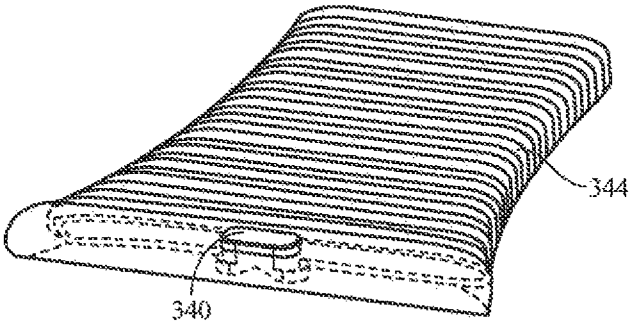

FIG. 21A-FIG. 21C illustrate an attachment system according to another embodiment of the present disclosure. In this embodiment, the attachment unit may include a button 340 having a rubber base. As shown in FIG. 21A, the rubber base of the button 340 may include a divot or notch that enables the rubber base to be squeezed or otherwise compressed. Further the button 340 may be configured to be placed directly into a recess within a band 344 such as shown in FIG. 21C and FIG. 21D.

For example, to insert the button 340 into a band 344, the rubber base is squeezed or compressed. Once the rubber base has been inserted into the recess, the notches expand within the recess holding the button 340 in place within the band 344. The rubber base also causes the button to be biased proud (e.g., about 0.4 mm) with respect to a top surface of the band 344 and also enables the button 340 to be compressed such that a top surface of the button 340 may be flush or substantially flush with respect to a top surface of the band 344.

Thus, when the band 344 and button 340 assembly are inserted into a channel of the housing, the band 344 may easily slide within the channel until the button 340 is in proximity to a recess within the channel. At this point, the button 340 may expand and be received into the recess. To remove the band 344, the button may be compressed using a button or other actuation mechanism.

Figure 22A:
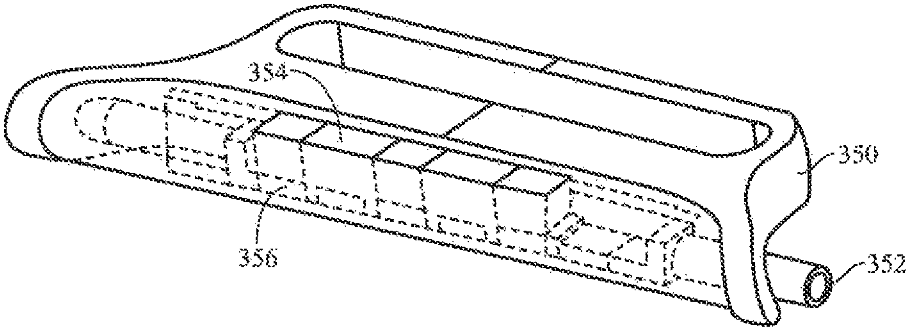
FIG. 22A-FIG. 22B illustrate a magnetic tooth assembly of an attachment unit according to one or more embodiments of the present disclosure.
Figure 22B:
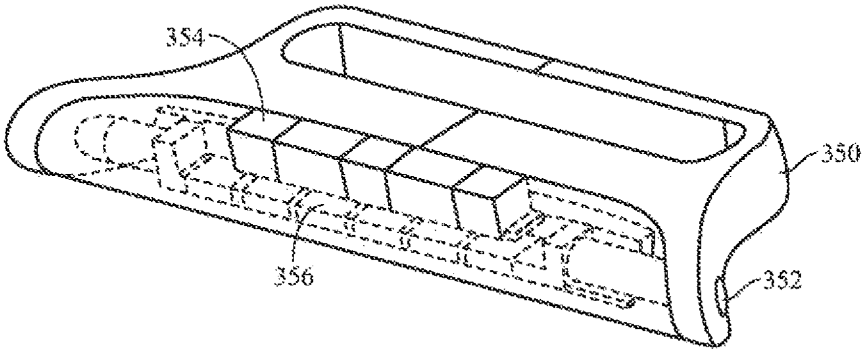

FIG. 22A-FIG. 22B illustrate an attachment unit having a magnetic tooth assembly 354 according to embodiments of the present disclosure. As with the other embodiments described herein, the magnetic tooth assembly 354 is configured to be received within a recess of a housing such as described herein.

In some embodiments, the magnetic tooth assembly 354 expands and contracts based on a magnetic force caused by a magnetic deployment mechanism 356 disposed beneath the magnetic tooth assembly 354. For example, actuation of a pin mechanism 352 causes the magnetic deployment mechanism 356 to move from a first position to a second position and exert a repulsive force on the magnetic tooth assembly 354. As a result of the repulsive force, the magnetic tooth assembly 354 moves from a retracted position (such as shown in FIG. 22A) to an extended position (shown in FIG. 22B).

In some embodiments and as shown, the pin mechanism 352 may protrude from one or more sides of the attachment unit 350 depending on whether the magnetic tooth assembly 354 is in the extended position or the contracted position. For example, as shown in FIG. 22A, the pin mechanism 352 may protrude from the attachment unit 350 when the magnetic tooth assembly 354 is retracted. Furthering the example, the pin mechanism 352 may be flush or substantially flush with one more sides of the attachment unit 350 when the magnetic tooth assembly 354 is in the extended position.

Figure 23A:
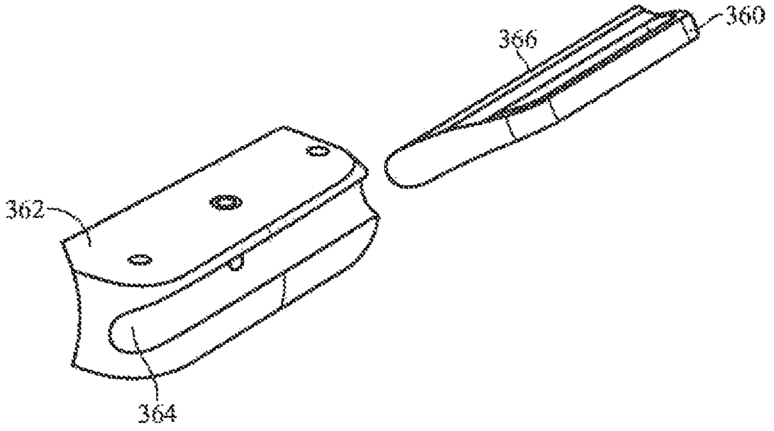
FIG. 23A-FIG. 23B illustrate an attachment system having an hourglass locking assembly disposed within the housing according to one or more embodiments of the present disclosure.
Figure 23B:
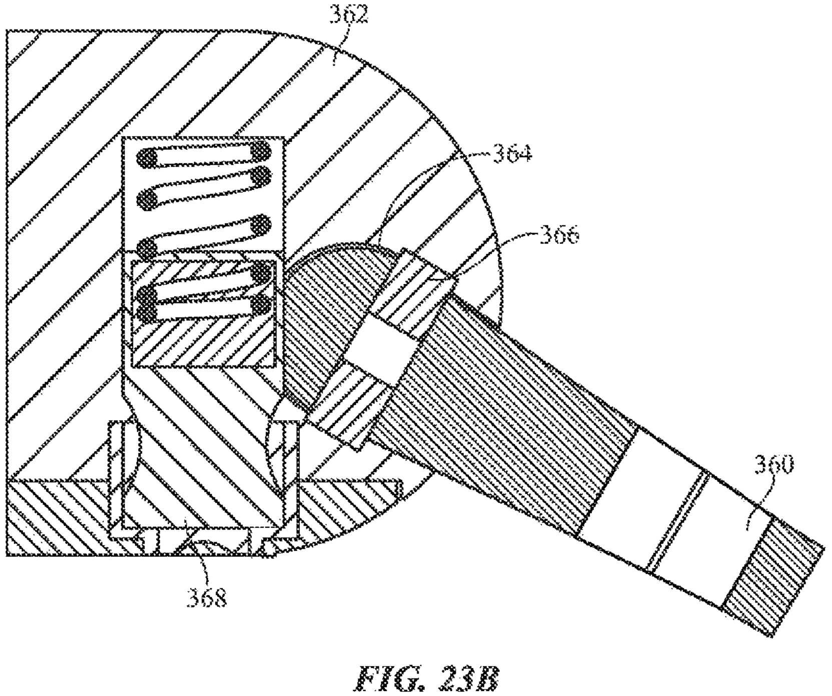

FIG. 23A-FIG. 23B illustrate an attachment system having an hourglass locking assembly disposed within a housing according to embodiments of the present disclosure. More specifically, the attachment system of this embodiment includes an attachment unit 360 that is configured to slide within a channel 364 of a housing 362. However, in this particular embodiment and as shown in detail in FIG. 23B, the attachment unit 360 includes a retractable band 366 disposed around a periphery of the attachment unit 360. The retractable band 366 may be inserted within a groove (not shown) of the channel 364 to help prevent the attachment unit 360 from being pulled or otherwise removed from the front of the channel 364.

As also shown in FIG. 23B, the housing 362 may include a spring loaded hourglass locking feature 368 configured to mate with or otherwise secure the attachment unit 360 within the channel 364 such as was described above. In some embodiments, the housing 362 may include an actuation hole that is configured to receive an actuation member that moves the spring loaded hourglass locking feature 368 between a locked state and an unlocked state.

Figure 24A:
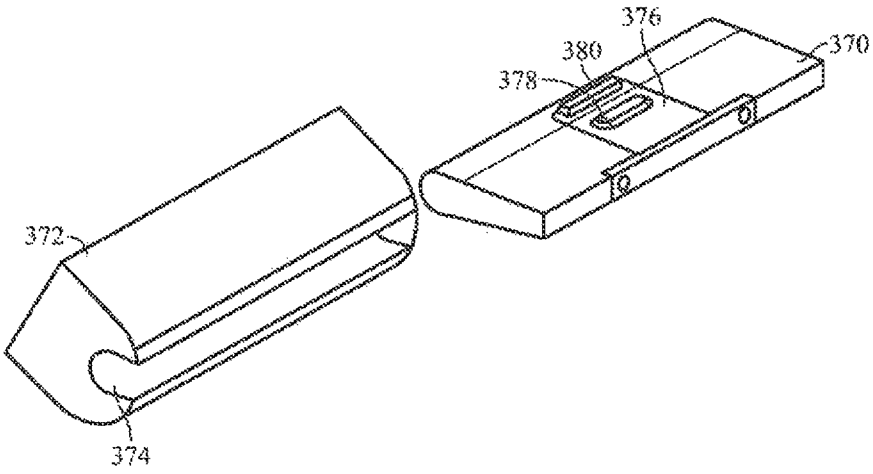
FIG. 24A-FIG. 24B illustrate an squeeze button assembly of an attachment unit according to one or more embodiments of the present disclosure.
Figure 24B:
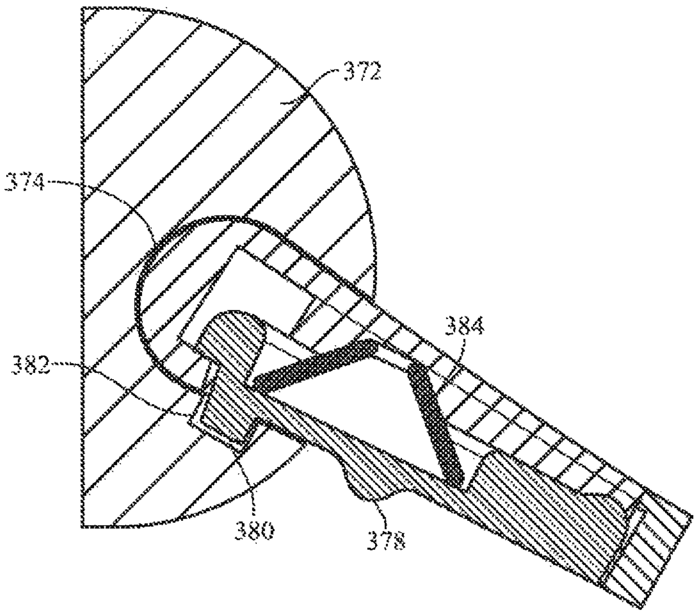

FIG. 24A-FIG. 24B illustrate an attachment system having a squeezable or compressible locking assembly according embodiments of the present disclosure. In some embodiments, the attachment system includes an attachment unit 370 that is configured to slide within a channel 374 of a housing 372. The attachment unit 370 includes a squeeze button assembly 376 having an actuation member 378 and a catch member 380. As with other embodiments described herein, the catch member 380 is configured to be received within recess 382 disposed within the channel 374 such as shown in FIG. 24B.

In this embodiment, the catch member 380 is retracted in response to a squeezing action on the squeeze button assembly 376. More specifically, when the actuation member 378 is moved toward the base of the attachment unit 370, a cone 384 disposed within the squeeze button assembly 376 contracts which causes the catch member 380 to move from an extended position to a retracted position. When the actuation member 378 is released, the catch member 380 moves back into the extended position. Thus, the above-described squeezing motion may enable the attachment unit to be inserted and removed from the channel 374.

Figure 25A:
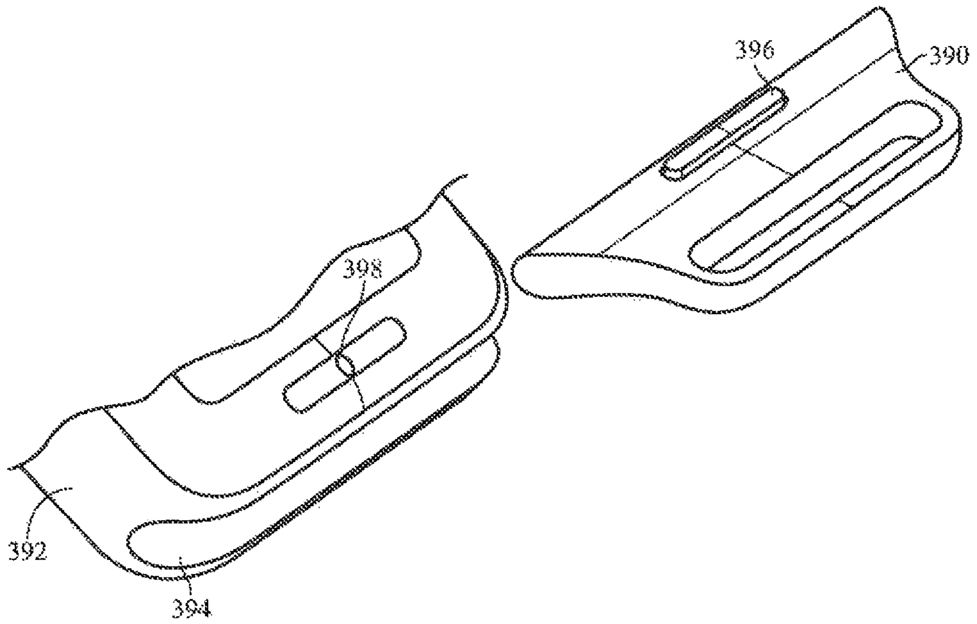
FIG. 25A-FIG. 25B illustrate an attachment system having a spring-biased catch member according to one or more embodiments of the present disclosure.
Figure 25B:
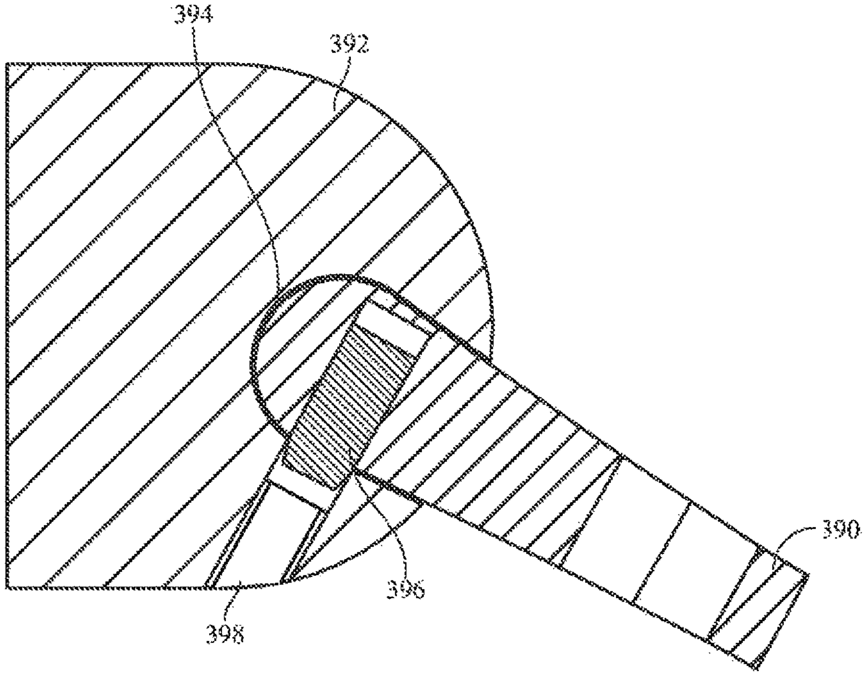

FIG. 25A-FIG. 25B illustrates an attachment system having a spring-biased locking assembly according to embodiments of the present disclosure. This attachment system includes an attachment unit 390 having a spring biased catch member 396 that is configured to retract in response to being inserted into a channel 394 of a housing 392.

More specifically, the catch member 396 may be spring biased proud with respect to a surface of the attachment unit 390. When the catch member 396 is inserted into the channel 394, contact with the channel 394 or other actuation mechanism causes the catch member 396 to retract. Once the catch member 396 is in proximity to a recess within the channel 394, the catch member 396 is permitted to expand and be received into the recess thereby locking the attachment unit 390 in place within the channel 394.

To release the catch member 396, an actuation mechanism (not shown) may be inserted through a hole 398 positioned above the recess in the channel 394. Force applied by the actuation mechanism causes the catch member 396 to retract. The attachment unit 390 may then be removed from the channel 394.

Figure 26A:
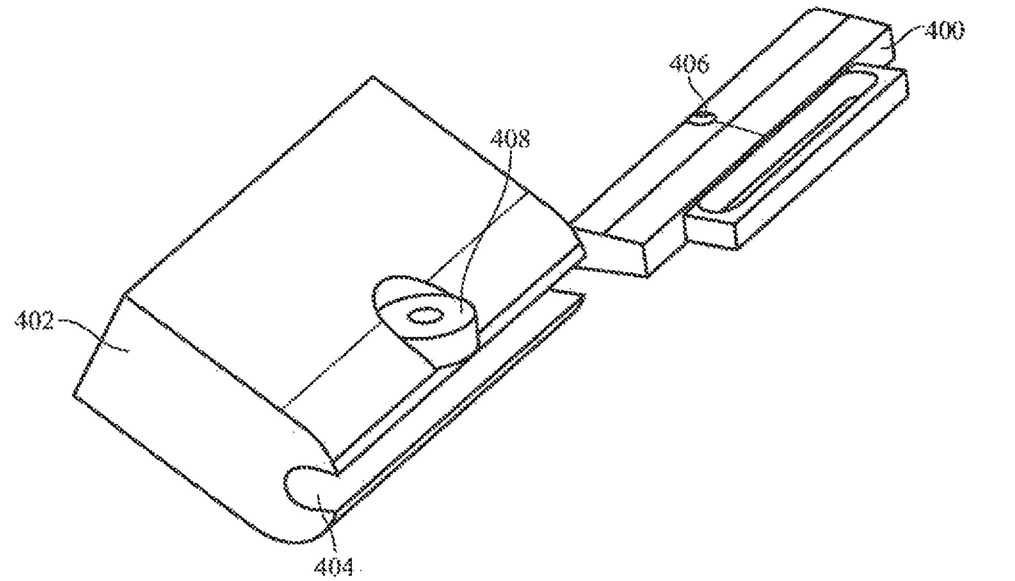
FIG. 26A-FIG. 26B illustrate an attachment system having a magnetic locking assembly according to one or more embodiments of the present disclosure.
Figure 26B:
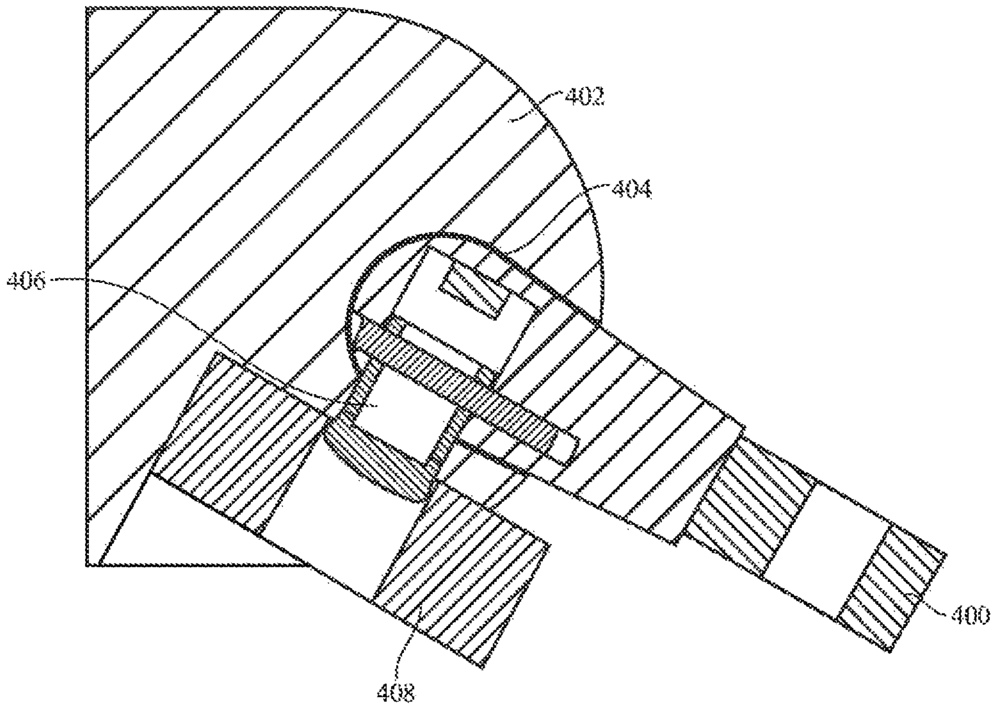

FIG. 26A-FIG. 26B illustrate an attachment system having a magnetic locking mechanism according to embodiments of the present disclosure. In this embodiment, the attachment system includes an attachment unit 400 configured for insertion into a channel 404 of a housing 402. The housing 402 includes a magnetic locking mechanism 408 that may be used to cause a catch member 406 disposed in the attachment unit 400 to move from a retracted position (such as shown in FIG. 26A) to an extended position (such as shown in FIG. 26B).

More specifically, the magnetic lock mechanism 408 causes the catch member 406 to extend from the attachment unit 400 when the catch member 406 is in proximity to the magnetic lock mechanism 408. When the catch member 406 is extended, the catch member is received into an opening within magnetic lock mechanism 408. To release the catch member 406, an actuation mechanism may be inserted through the hole.

In some embodiments, a magnet may be present in the attachment unit 400 to keep the catch member 406 flush or substantially flush with respect to a top surface of the attachment unit when the catch member 406 is in a retracted state.

In the embodiments described above, the attachment system is configured to be received into a channel of a housing of a consumer product. This may be done by sliding the attachment into an open end of the channel and in some embodiments may be done by forward insertion. In some embodiments the channel and the attachment system may take on a variety of shapes and sizes. Further the shape and/or curvature of the channel may follow the shape and/or curvature of the housing.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

Further, regardless of whether the features shown and described herein are shown and described in combination or separately, the various features, including structural features and methodological features, are intended to be selectively included or omitted to produce an embodiment with a particular set of features. Further, the directions and orientations described above may be reversed. For example a top portion or surface in one embodiment may be a bottom portion or surface in another embodiment. Likewise, a bottom portion or surface in one embodiment may be a top surface or portion in another embodiment. Having been provided with the description and illustration of the present application, one skilled in the art may envision variations, modifications, and alternate embodiments falling within the spirit of the broader aspects of the embodiments described herein that do not depart from the broader scope of the claimed embodiments.

We claim:

1. A watch comprising:

a housing having a channel and a recess; and a band having an attachment unit configured to be inserted within the channel, wherein the attachment unit comprises:

a body portion insertable into the channel; and a catch member defining a terminal end of the attachment unit and being configured to pivot with respect to the body portion from a first position to a second position, wherein:

while the catch member is in the first position, the attachment unit is permitted to slide within the channel; and while the catch member is in the second position with a portion of the catch member within the recess of the housing, the attachment unit is locked in place within the channel.

2. The watch of claim 1, wherein the catch member is configured to pivot between the first position to the second position while within the channel of the housing.

3. The watch of claim 1, wherein a shoulder is positioned at a transition from the channel to the recess, wherein while in the second position the catch member engages the shoulder.

4. The watch of claim 1, wherein the catch member forms a convex surface at a terminal end of the band.

5. The watch of claim 1, wherein the catch member forms a hook.

6. The watch of claim 1, wherein the housing comprises a first magnet and the catch member comprises a second magnet, wherein the first magnet magnetically pulls the catch member into the second position.

7. The watch of claim 1, wherein the catch member has a ramp that enables the catch member to move from the second position to the first position in response to an applied force.

8. A watch comprising:

a housing having a channel and a locking mechanism movable from a first position and a second position, wherein the locking mechanism has an end exposed at a surface of the housing for actuation of the locking mechanism by an applied force; and a band having an attachment unit configured to be inserted within the channel, wherein the attachment unit comprises a recess defined at a terminal end of the attachment unit, wherein:

while the locking, mechanism is in the first position, the attachment unit is permitted to slide within the channel past the locking mechanism; and while the locking mechanism is in the second position with a portion of the locking mechanism within the recess of the attachment unit, the attachment unit is locked in place within the channel.

9. The watch of claim 8, further comprising a spring biasing the locking mechanism toward the second position.

10. The watch of claim 8, wherein the convex surface and the concave surface are aligned when the locking mechanism is in the first position.

11. The watch of claim 8, further comprising ribs within the channel and extending toward each other and against the attachment unit when the attachment unit is inserted within the channel.

12. A watch comprising;

a housing comprising:

a channel;

a button recess; and a button movable within the button recess; and a band having an attachment unit comprising:

a body portion insertable into the channel;

a first bar latch portion; and a second bar latch portion pivotably coupled to the first bar latch portion, wherein the first and second bar latch portions are biased to extend into the button recess while the body portion is within the channel, and the button is moveable to urge the first and second bar latch portions out of the button recess.

13. The watch of claim 12, wherein the bar latch is spring-biased to extend into the button recess while the body portion is within the channel.

14. The watch of claim 12, wherein the first bar latch and the second bar latch each comprise a protrusion that extends into the button recess while the body portion is within the channel.

15. The watch of claim 12, wherein the button recess comprises a first button recess portion and a second button recess portion, wherein the first bar latch portion is biased to extend into the first button recess portion while the body portion is within the channel and the second bar latch portion is biased to extend into the second button recess portion while the body portion is within the channel.

16. The watch of claim 12, wherein the channel has a protrusion that is configured to fit within a space between the first bar latch portion and the second bar latch portion.

17. The watch of claim 12, wherein the button configured to urge both the first bar latch portion and the second bar latch portion simultaneously.

* * * * *